US012527000B2

(12) United States Patent
Ramaswamy

(10) Patent No.: US 12,527,000 B2
(45) Date of Patent: Jan. 13, 2026

(54) METHODS OF FORMING A DEVICE, AND RELATED DEVICES, MEMORY DEVICES, AND ELECTRONIC SYSTEMS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 305 days.

(21) Appl. No.: 16/596,507

(22) Filed: Oct. 8, 2019

(65) Prior Publication Data

US 2020/0111800 A1 Apr. 9, 2020

Related U.S. Application Data

(60) Provisional application No. 62/743,114, filed on Oct. 9, 2018.

(51) Int. Cl.
*H01L 27/11507* (2017.01)
*H01L 27/108* (2006.01)
(Continued)

(52) U.S. Cl.
CPC .......... *H10B 53/30* (2023.02); *H10B 12/033* (2023.02); *H10B 12/05* (2023.02); *H10B 12/31* (2023.02);
(Continued)

(58) Field of Classification Search
None
See application file for complete search history.

(56) References Cited

U.S. PATENT DOCUMENTS 4,638,458 A * 1/1987 Itoh ..................... H01L 23/5283
257/E23.152
5,763,923 A * 6/1998 Hu ..................... C23C 14/3414
257/E29.155

(Continued)

FOREIGN PATENT DOCUMENTS

CN 103456639 A 12/2013
WO 2018/063308 A1 4/2018

OTHER PUBLICATIONS

Tamura et al. Nanostructured thin films for hydrogen-permeation barrier, J. Vac. Sci. Technol. A 33(4), 2015, 041503-1 (Year: 2015).*

(Continued)

*Primary Examiner* — Erik T. K. Peterson
(74) *Attorney, Agent, or Firm* — TraskBritt

(57) ABSTRACT

A method of forming a device comprises forming sacrificial pillar structures over conductive structures overlying a barrier structure substantially impermeable to hydrogen. The sacrificial pillar structures are separated from one another by trenches linearly extending in a first lateral direction orthogonal to a second lateral direction in which the conductive structures linearly extend. Gate electrodes are formed within the trenches and laterally adjacent sidewalls of the sacrificial pillar structures. The sacrificial pillar structures are removed to form openings between the gate electrodes. Dielectric liner structures are formed within the openings and laterally adjacent sidewalls of the gate electrodes. Channel structures are formed within the openings after forming the dielectric liner structures. The channel structures comprise a semiconductive material having a band gap larger than that of polycrystalline silicon. Conductive contacts are formed on the channel structures. A device, a memory device, and an electronic system are also described.

7 Claims, 16 Drawing Sheets

(51) Int. Cl.
*H01L 29/66* (2006.01)
*H01L 29/786* (2006.01)
*H10B 12/00* (2023.01)
*H10B 53/30* (2023.01)
*H10D 30/01* (2025.01)
*H10D 30/67* (2025.01)

(52) U.S. Cl.
CPC ....... *H10D 30/031* (2025.01); *H10D 30/6728* (2025.01)

(56) References Cited

U.S. PATENT DOCUMENTS

| | | | |
|---|---|---|---|
| 6,051,859 A * | 4/2000 | Hosotani | H10D 1/711 257/E21.018 |
| 6,297,527 B1 | 10/2001 | Agarwal et al. | |
| 6,815,805 B2 | 11/2004 | Weimer | |
| 6,864,191 B2 | 3/2005 | Yoon | |
| 8,299,516 B2 | 10/2012 | Weng et al. | |
| 8,895,979 B2 | 11/2014 | Chang et al. | |
| 9,082,793 B1 | 7/2015 | Ahmed | |
| 9,246,013 B2 | 1/2016 | Ahmed | |
| 9,397,145 B1 | 7/2016 | Sills et al. | |
| 9,698,272 B1 | 7/2017 | Ikeda et al. | |
| 9,773,888 B2 | 9/2017 | Pulugurtha et al. | |
| 2001/0035555 A1* | 11/2001 | Nonaka | H01L 23/5223 257/E23.153 |
| 2001/0050388 A1* | 12/2001 | Hamamoto | H10B 12/488 257/E21.651 |
| 2001/0050392 A1* | 12/2001 | Nakamura | H10B 12/033 257/306 |
| 2002/0019107 A1* | 2/2002 | Lin | H10D 1/716 257/E21.011 |
| 2002/0022357 A1* | 2/2002 | Lijima | H01L 21/02337 438/622 |
| 2004/0094791 A1* | 5/2004 | Ito | H01L 28/55 257/310 |
| 2004/0125578 A1* | 7/2004 | Konishi | H01L 24/97 257/E23.125 |
| 2004/0166668 A1* | 8/2004 | Ito | H01L 27/10817 438/637 |
| 2004/0185635 A1* | 9/2004 | Tatsunari | H01L 27/10852 438/396 |
| 2004/0259298 A1* | 12/2004 | Graf | H10B 12/09 438/257 |
| 2005/0048717 A1* | 3/2005 | Ito | H10D 1/042 257/E21.648 |
| 2005/0230779 A1* | 10/2005 | Ito | H01L 28/57 257/499 |
| 2005/0285170 A1* | 12/2005 | Mikawa | H01L 27/11502 257/295 |
| 2005/0287787 A1* | 12/2005 | Kloster | H01L 21/02178 438/618 |
| 2006/0030110 A1 | 2/2006 | Kumura et al. | |
| 2006/0228852 A1* | 10/2006 | Chien | H01L 21/76811 257/E21.507 |
| 2007/0108489 A1* | 5/2007 | Nagai | H01L 27/11502 257/295 |
| 2008/0166874 A1* | 7/2008 | Deligianni | H01L 21/76879 438/675 |
| 2009/0163000 A1 | 6/2009 | Cho et al. | |
| 2009/0218640 A1* | 9/2009 | Hampp | H01L 21/76895 257/E21.294 |
| 2009/0250792 A1* | 10/2009 | Liou | H01L 23/522 257/E23.179 |
| 2010/0052021 A1 | 3/2010 | Mocho | |
| 2010/0213572 A1* | 8/2010 | Ching | H10B 10/00 257/532 |
| 2011/0215396 A1* | 9/2011 | Tang | H01L 29/861 257/329 |
| 2011/0230543 A1* | 9/2011 | Feinstein | C12N 15/113 536/24.5 |
| 2011/0254160 A1* | 10/2011 | Tsai | H01L 23/13 257/738 |
| 2011/0304999 A1* | 12/2011 | Yu | H01L 25/03 29/829 |
| 2012/0058619 A1 | 3/2012 | Park et al. | |
| 2012/0228739 A1* | 9/2012 | Udayakumar | H01L 21/76843 257/532 |
| 2012/0299090 A1* | 11/2012 | Kim | H10D 30/023 257/E29.264 |
| 2012/0313208 A1* | 12/2012 | Kim | H10F 39/199 257/435 |
| 2013/0069052 A1 | 3/2013 | Sandhu | |
| 2013/0285051 A1 | 10/2013 | Tanaka | |
| 2013/0330894 A1* | 12/2013 | Gu | H10B 41/35 438/264 |
| 2013/0330903 A1* | 12/2013 | Malhotra | H10D 1/692 438/396 |
| 2014/0353833 A1* | 12/2014 | Peng | H01L 23/49811 257/784 |
| 2015/0076495 A1* | 3/2015 | Miyairi | H01L 29/78642 257/43 |
| 2015/0130046 A1* | 5/2015 | Lin | H01L 25/105 438/122 |
| 2016/0027804 A1 | 1/2016 | Li et al. | |
| 2016/0049406 A1 | 2/2016 | Sandhu | |
| 2016/0079268 A1 | 3/2016 | Sakuma et al. | |
| 2016/0079385 A1 | 3/2016 | Ellinger et al. | |
| 2016/0276454 A1 | 9/2016 | Sandhu | |
| 2016/0336059 A1* | 11/2016 | Matsuzaki | H01L 29/4908 |
| 2016/0341656 A1* | 11/2016 | Liu | G01N 21/648 |
| 2017/0141233 A1 | 5/2017 | Shimomura et al. | |
| 2018/0090679 A1 | 3/2018 | Sills et al. | |
| 2018/0197942 A1* | 7/2018 | Ramaswamy | H01L 28/60 |
| 2018/0226289 A1* | 8/2018 | Bielefeld | H01L 21/76826 |
| 2019/0051589 A1* | 2/2019 | Lin | H01L 23/5384 |
| 2019/0148340 A1* | 5/2019 | Yu | H01L 21/56 257/737 |
| 2019/0206876 A1* | 7/2019 | Yuki | H10B 12/033 |
| 2019/0296155 A1* | 9/2019 | Sawabe | H01L 27/10873 |
| 2019/0326296 A1* | 10/2019 | Wang | H10B 12/50 |
| 2020/0066729 A1* | 2/2020 | Simsek-Ege | H10B 12/482 |
| 2020/0075496 A1* | 3/2020 | Yu | H01L 24/05 |
| 2020/0212046 A1* | 7/2020 | Ishii | H10B 12/02 |
| 2020/0279851 A1* | 9/2020 | Endo | H01L 27/10852 |
| 2021/0013213 A1* | 1/2021 | Kim | H10B 12/30 |

OTHER PUBLICATIONS

Song et al. Thickness dependence of hydrogen permeability for Ni—BaCe0.8Y0.2O3—δ, Solid State Ionics 179 (2008) 1854-1857 (Year: 2008).*

B. Zajec, Hydrogen permeation barrier e Recognition of defective barrier film from transient permeation rate. Intl. J. Hydrogen Energy 36(2011) 7353-7361 (Year: 2011).*

V. Nemanic, Hydrogen permeation barriers: Basic requirements, materials selection, deposition methods, and quality evaluation, Nuclear Materials and Energy 19 (2019) 451-457 (Year: 2019).*

Billah et al. TCAD Simulation of Dual-Gate a-IGZO TFTs With Source and Drain Offsets, IEEE Electron Device Letters, vol. 37, No. 11, (Nov. 2016), pp. 1442-1445.

Liu et al., Highly Flexible Electronics from Scalable Vertical Thin Film Transistors, Nano Letters, vol. 14, (2014), pp. 1413-1418.

Petti et al., Flexible Quasi-Vertical In—Ga—Zn—O Thin-Film Transistor With 300-nm Channel Length, vol. 36, No. 5, (May 2015), pp. 475-477.

Yoon et al., Effects of Deposition Temperature on the Device Characteristics of Oxide Thin-Film Transistors Using In—Ga—Zn—O Active Channels Prepared by Atomic-Layer, Applied Materials &Interfaces, vol. 9, (2017), pp. 22676-22684.

Zheng et al., All-Sputtered, Flexible, Bottom-Gate IGZO/Al2O3 Bi-Layer Thin Film Transistors on PEN Fabricated by a Fully Room Temperature Process, Journals of Materials Chemistry C, vol. 5, (2017), pp. 7043-7050.

Khakani et al., Reactive Pulsed Laser Deposition of Iridium Oxide Thin Films, Thin Solid Films, vol. 335, (1998), pp. 6-12.

(56) References Cited

OTHER PUBLICATIONS

Correia et al., A Second-Order S? ADC Using Sputtered IGZO TFTs, Chapter 2, Thin-Film Transistors, (2016), pp. 5-15.
Kushida-Abdelghafar et al., Post-Annealing Effects on Anitreduction Characteristics of IrO2/Pb(ZrxTi1-x)O3/Pt Ferroelectric Capacitors, Journal of Applied Physics, vol. 85, No. 2, (Jan. 15, 1999), pp. 1069-1074.
International Search Report from International Application No. PCT/US2019/055113, dated Jan. 22, 2020, 3 pages.
International Written Opinion from International Application No. PCT/US2019/055113, dated Jan. 22, 2020, 7 pages.
Taiwanese Office Action for Application No. 108136502, dated Jul. 14, 2020, 17 pages.
European Extended Search Report and Opinion for European Application No. 19870442.1, dated May 16, 2022, 7 pages.
Korean Notice of Reasons for Rejection for Korean Application No. 10-2021-701856, dated Jul. 22, 2022, 18 pages with English translation.
Chinese First Office Action for Chinese Application No. 201980072358.6, dated Sep. 29, 2023, 10 pages with translation.

\* cited by examiner

METHODS OF FORMING A DEVICE, AND RELATED DEVICES, MEMORY DEVICES, AND ELECTRONIC SYSTEMS

CROSS-REFERENCE TO RELATED APPLICATION

This application claims the benefit under 35 U.S.C. § 119(e) of U.S. Provisional Patent Application Ser. No. 62/743,114, filed Oct. 9, 2018, the disclosure of which is hereby incorporated herein in its entirety by this reference.

TECHNICAL FIELD

Embodiments of the disclosure relate to the field of semiconductor device design and fabrication. More specifically, embodiments of the disclosure relate to methods of forming a semiconductor device, and to related semiconductor devices, memory devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), ferroelectric random access memory (FeRAM), FLASH memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device (e.g. a transistor) and a memory storage structure (e.g., a capacitor). The access device generally includes a channel region between a pair of source/drain regions, and a gate configured to electrically connect the source/drain regions to one another through the channel region. The access devices can comprise planar access devices or vertical access devices. Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base structure thereunder, and current flow between source and drain regions of a planar access device is primarily parallel to the primary surface of the substrate or base thereunder.

Many conventional access devices employ semiconductive materials such as monocrystalline silicon and polycrystalline silicon for the channels thereof. However, the use of such materials can result in some less desirable electrical properties in the access device (e.g., high off current ($I_{off}$), low electron carrier mobility, scattering at an interface between a gate oxide material and the channel). In addition, the relatively small band gaps of such materials can hinder (or even preclude) improvements to other electrical properties (e.g., higher on current ($I_{on}$), faster switching speed, lower operating voltage, reduced current leakage) of the access device. Other semiconductive materials, such as oxide semiconductor materials, have been investigated as alternatives for monocrystalline silicon and polycrystalline silicon for the channels of access devices. Such materials can have larger band gaps than monocrystalline silicon and polycrystalline silicon, and employing such materials can facilitate improved electrical properties (e.g., lower $I_{off}$) in the access devices. However, conventional methods of forming channels from oxide semiconductor materials can negatively affect the electrical properties of the access devices including the channels. For example, conventional methods of etching a bulk volume of oxide semiconductor material to form vertically-oriented channels (e.g., a channel pillar including the oxide semiconductor material) for vertical access devices can expose the oxide semiconductor material to etch chemistries (e.g., hydrogen containing plasmas) that can negatively impact current flow through the vertically-oriented channels, limiting the performance of the vertical access devices and of semiconductor devices (e.g., memory devices) employing the vertical access devices.

A need, therefore, exists for new methods of forming semiconductor devices, as well as for new semiconductor devices and electronic systems.

DETAILED DESCRIPTION

Figure 1:
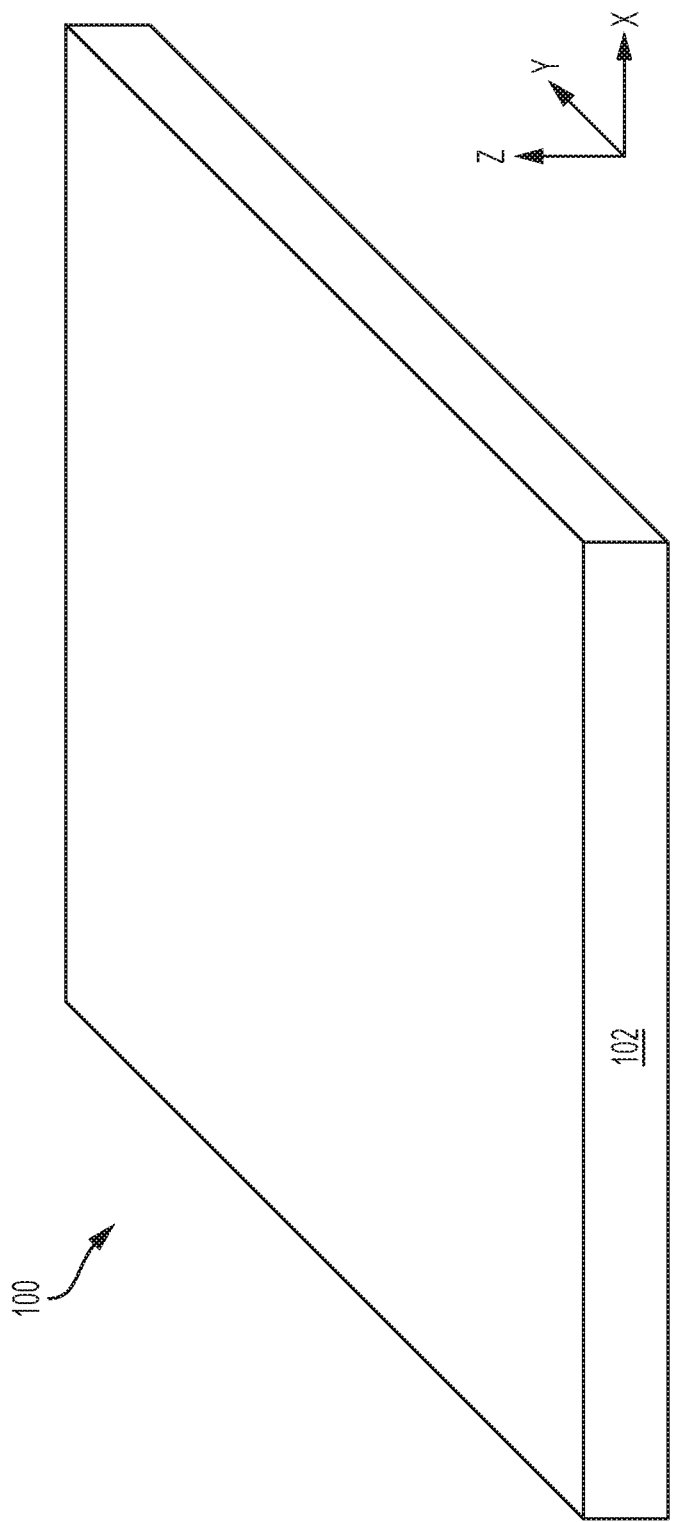
FIGS. 1 through 13 are simplified perspective (i.e., FIGS. 1 through 4) and simplified partial cross-sections (i.e., FIGS. 5 through 7, 8A, 8B, and 9 through 13) views illustrating embodiments of a method of forming a semiconductor device structure, in accordance with embodiments of the disclosure.

Methods of forming a semiconductor device are described, as are related semiconductor devices, memory devices, and electronic systems. The methods and structures of the disclosure may facilitate the formation of devices (e.g., transistors, semiconductor devices, memory devices) and systems (e.g., electronic systems) having one or more of increased performance, reduced off-state current, increased efficiency, increased reliability, and increased durability as compared to conventional devices (e.g., conventional access devices, conventional semiconductor devices, conventional memory devices) and conventional systems (e.g., conventional electronic systems).

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically neighboring" or "longitudinally neighboring" features (e.g., structures, devices) means and includes features located most vertically proximate (e.g., vertically closest) one another. In addition, as used herein, "horizontally neighboring" or "laterally neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), and/or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization ("CMP")), and/or other known methods.

FIGS. 1 through 13 are simplified perspective (i.e., FIGS. 1 through 4) and simplified partial cross-sections (i.e., FIGS. 5 through 7, 8A, 8B, and 9 through 13) views illustrating embodiments of a method of forming a semiconductor device structure (e.g., a memory structure) for a semiconductor device (e.g., a memory device, such as an FeRAM device, a DRAM device, an RRAM device, a conductive bridge RAM device, an MRAM device, a PCM device, a PCRAM device, a STTRAM device, an oxygen vacancy-based memory device, a programmable conductor memory device). With the description provided below, it will be readily apparent to one of ordinary skill in the art that the methods described herein may be used in various devices. In other words, the methods of the disclosure may be used whenever it is desired to form a semiconductor device.

Referring to FIG. 1, a semiconductor device structure 100 is formed to include a first barrier structure 102. The first barrier structure 102 is formed of and includes at least one dielectric material substantially impermeable to hydrogen. The first barrier structure 102 may substantially impede (e.g., prevent) diffusion of hydrogen therethrough, such as, for example, during subsequent hydrogen annealing of the semiconductor device structure 100. By way of non-limiting example, the first barrier structure 102 may comprise one or more of an aluminum oxide ($AlO_x$), an aluminum oxynitride ($AlO_xN_y$), an aluminum silicon nitride ($AlSi_xN_y$), a silicon alumina oxynitride ($AlSi_xO_yN_z$), a boron nitride ($BN_x$), a boron carbon nitride ($BC_xN_y$), a silicon carbide ($SiC_x$), a silicon carbon nitride ($SiC_xN_y$), and a silicon nitride ($SiN_x$). Formulae including one or more of "x," "y," and "z" above (e.g., $AlO_x$, $AlO_xN_y$, $AlSi_xN_y$, $AlSi_xO_yN_z$, $BN_x$, $BC_xN_y$, $SiC_x$, $SiC_xN_y$, $SiN_x$) represent a composite material that contains, throughout one or more regions thereof, an average ratio of "x" atoms of one element, "y" atoms of another element (if any), and "z" atoms of an additional element (if any), for every one atom of aluminum (Al), boron (B), or silicon (Si). As the formulae are representative of relative atomic ratios and not strict chemical structure, the first barrier structure 102 may comprise one or more stoichiometric compounds and/or one or more non-stoichiometric compounds throughout different regions thereof, and values of "x," "y," and/or "z" may be integers or may be non-integers throughout the different regions thereof. As used herein, the term "non-stoichiometric compound" means and includes a chemical compound with an elemental composition that cannot be represented by a ratio of well-defined natural numbers and is in violation of the law of definite proportions. In some embodiments, the first barrier structure 102 comprises $AlO_x$. The first barrier structure 102 may be formed on or over a base structure (e.g., a substrate).

Figure 2:
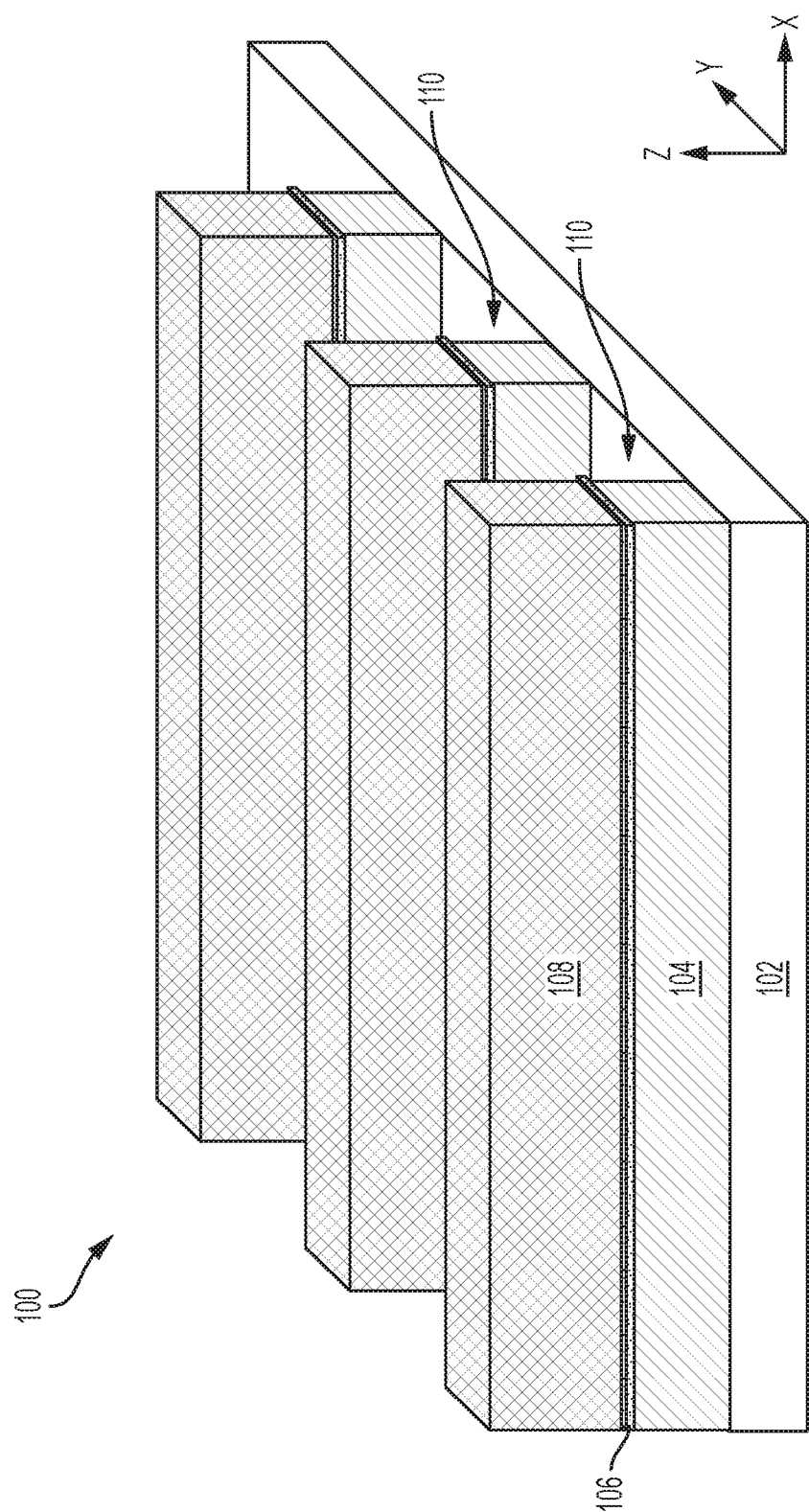

Referring next to FIG. 1, linear conductive structures 104 may be formed on or over the first barrier structure 102, and linear sacrificial structures 108 may be formed on or over the linear conductive structures 104. In addition, optionally, and as shown in FIG. 2, one or more additional linear conductive structures 106 may be formed vertically between the linear conductive structures 104 and the linear sacrificial structures 108. The linear conductive structures 104, linear sacrificial structures 108, and the additional linear conductive structures 106 (if any) may laterally extending in substantially the same direction (e.g., the X-direction) as one another, and may exhibit substantially similar lateral dimensions (e.g., lengths, widths) as one another. Trenches 110 may laterally intervene (e.g., in the Y-direction) between and separate laterally neighboring linear conductive structures 104, laterally neighboring linear sacrificial structures 108, and laterally neighboring additional linear conductive structures 106 (if any). The trenches 110 may vertically extend (e.g., in the Z-direction) from upper surfaces of the linear sacrificial structures 108 to an upper surface of the first barrier structure 102.

The linear conductive structures 104 may be formed of and include at least one electrically conductive material, such as one or more of a metal, an alloy, a conductive metal oxide, a conductive metal nitride, a conductive metal silicide, and a conductively doped semiconductor material. By way of non-limiting example, the linear conductive structures 104 may be formed of and include one or more of ruthenium (Ru), tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium oxide ($RuO_x$), ruthenium titanium nitride (RuTiN), and conductively doped silicon. In some embodiments, the linear conductive structures 104 are formed of and include Ru. The linear conductive structures 104 may serve as digit lines (e.g., data lines, bit lines), as described in further detail below.

The linear sacrificial structures 108 may be formed of and include at least one material able to be selectively removed relative to the linear conductive structures 104, the additional linear conductive structures 106 (if any), and one or more subsequently-formed materials (e.g., dielectric materials). Subsequent selective removal of the material of the linear sacrificial structures 108 may facilitate the formation of channel structures (e.g., vertical channel structures) for the semiconductor device structure 100 (e.g., through a damascene process) without having to subject the material of the channel structures to one or more subtractive material removal (e.g., etching) processes that may otherwise negatively impact desired characteristics (e.g., current flow characteristics) of the channel structures, as described in further detail below. By way of non-limiting example, the linear sacrificial structures 108 may be formed of and include silicon (e.g., single crystalline silicon, polycrystalline silicon), silicon nitride, a carbon-containing material (e.g., SiOCN), carbon, a photoresist material, or another material. In some embodiments, the linear sacrificial structures 108 are formed of and include polycrystalline silicon.

The additional linear conductive structures 106, if any, may be formed of and include at least one electrically conductive material (e.g., one or more of a metal, an alloy, a conductive metal oxide, a conductive metal nitride, a conductive metal silicide, and a conductively doped semiconductor material) different than the electrically conductive material of the linear conductive structures 104. By way of non-limiting example, the additional linear conductive structures 106 may be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, RuTiN, and conductively doped silicon. In some embodiments, the additional linear conductive structures 106 are formed of and include TiN.

The linear conductive structures 104, the linear sacrificial structures 108, the additional linear conductive structures 106 (if any), and the trenches 110 may each individually be formed to exhibit any desired dimensions and spacing. The dimensions and spacing the linear conductive structures 104, the linear sacrificial structures 108, the additional linear conductive structures 106 (if any), and the trenches 110 may be selected at least partially based on a desired function of the semiconductor device structure 100 and on dimensions and desired spacing of additional components (e.g., additional structures, additional materials) of the semiconductor device structure 100 to be subsequently formed, as described in further detail below. As shown in FIG. 2, if formed, the additional linear conductive structures 106 may exhibit reduced thickness relative to the linear conductive structures 104.

The linear conductive structures 104, the linear sacrificial structures 108, the additional linear conductive structures 106 (if any), and the trenches 110 may be formed using conventional processes (e.g., conventional deposition processes, such as one or more of in situ growth, spin-on coating, blanket coating, CVD, PECVD, ALD, and PVD; conventional material removal processes, such as conventional photolithography processes and conventional etching processes), which are not described in detail herein.

Figure 3:
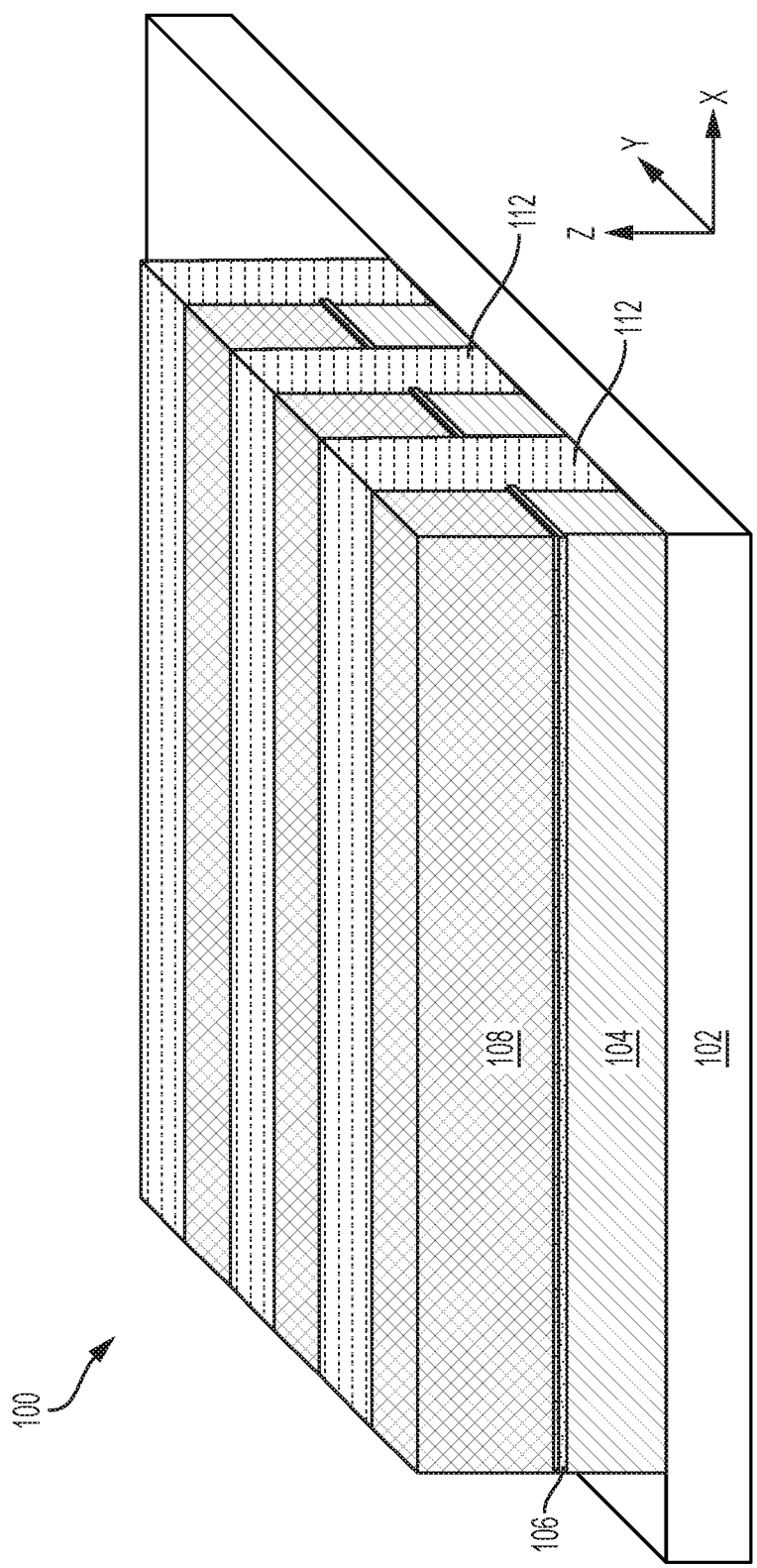

Referring next to FIG. 3, linear dielectric structures 112 may be formed within the trenches 110 (FIG. 2) of the semiconductor device structure 100. The linear dielectric structures 112 may substantially fill the trenches 110, and may be substantially confined within the boundaries (e.g., vertical boundaries, lateral boundaries) of the trenches 110. As shown in FIG. 3, upper surfaces of the linear dielectric structures 112 may be substantially coplanar with upper surfaces of the linear sacrificial structures 108.

The linear dielectric structures 112 may be formed of and include at least one dielectric material, such as one or more of a dielectric oxide material (e.g., a silicon oxide, such as silicon dioxide ($SiO_2$); phosphosilicate glass; borosilicate glass; borophosphosilicate glass; fluorosilicate glass; aluminum oxide; high-k oxides, such as hafnium oxide ($HfO_x$); a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. In some embodiments, the linear dielectric structures 112 comprise $SiO_2$.

The linear dielectric structures 112 may be formed using conventional processes and conventional processing equipment, which are not described in detail herein. By way of non-limiting example, a dielectric material may be non-conformally formed (e.g., deposited) over exposed surfaces of the linear conductive structures 104, the linear sacrificial structures 108, the additional linear conductive structures 106 (if any), and the first barrier structure 102 inside and outside of the trenches 110 (FIG. 2), and portions of dielectric material outside of the trenches 110 may be removed through at least one planarization process, such as a conventional CMP process.

Figure 4:
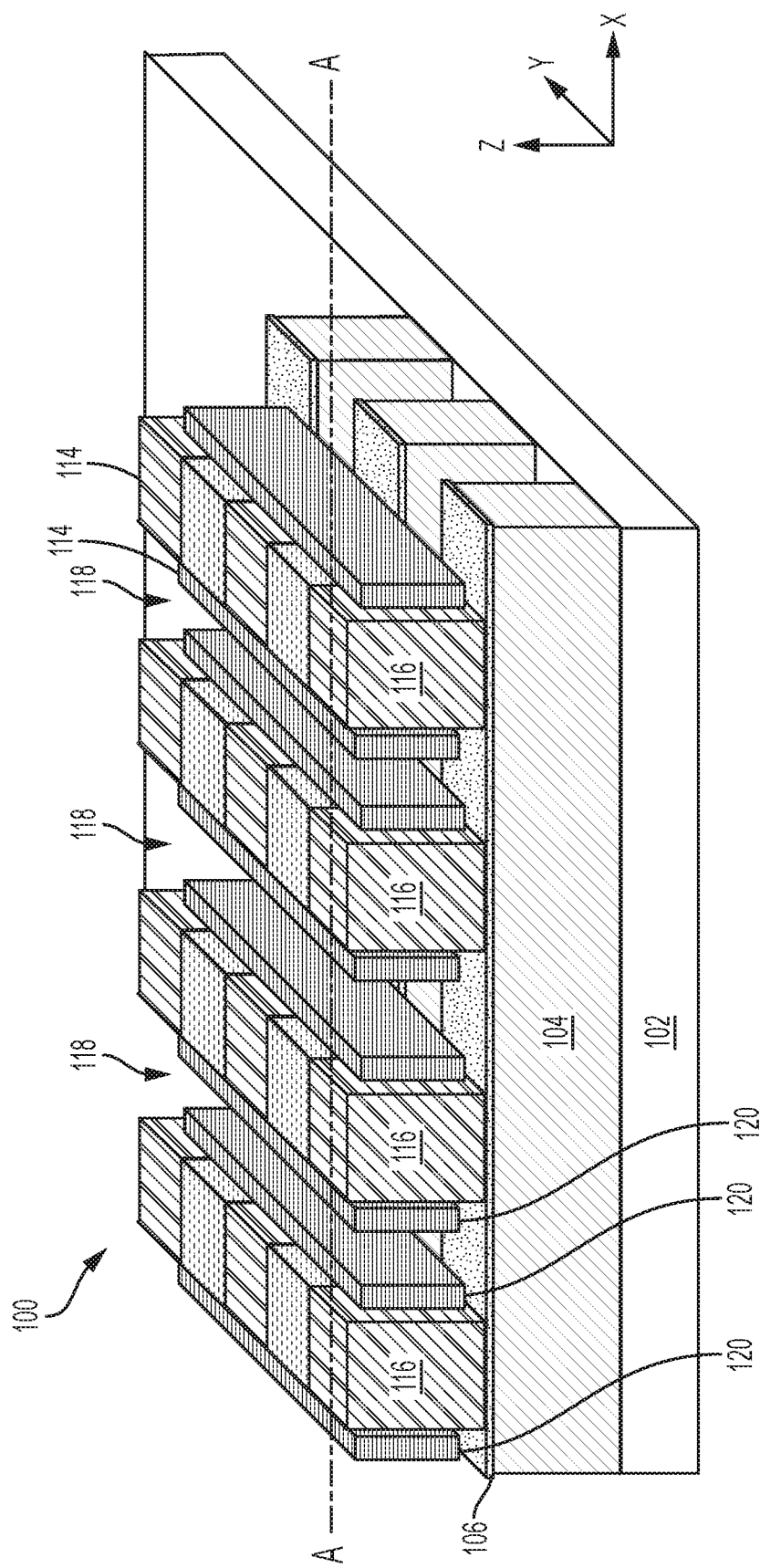

Referring next to FIG. 4, portions of the linear sacrificial structures 108 (FIG. 3) and the linear dielectric structures 112 (FIG. 3) may be removed to form sacrificial pillar structures 116, dielectric pillar structures 114, and additional trenches 118 laterally extending in a direction (e.g., the Y-direction) perpendicular to the direction in which the linear conductive structures 104 extend; and linear gate electrodes 120 (e.g., gate electrodes) may be formed within the additional trenches 118. The linear gate electrodes 120 may serve as word lines (e.g., access lines), as described in further detail below. As shown in FIG. 4, the additional trenches 118 laterally intervene (e.g., in the X-direction) between and separate laterally neighboring sacrificial pillar structures 116 and laterally neighboring dielectric pillar structures 114. Sidewalls (e.g., side surfaces) of the sacrificial pillar structures 116 may be substantially coplanar with sidewalls of the dielectric pillar structures 114.

The sacrificial pillar structures 116, the dielectric pillar structures 114, and the additional trenches 118 may be formed by subjecting the semiconductor device structure 100 to at least one material removal process (e.g., at least one etching process). The material removal process may remove exposed portions of the linear sacrificial structures 108 (FIG. 3) and the linear dielectric structures 112 (FIG. 3) while leaving the first barrier structure 102, the linear conductive structures 104, and the additional linear conductive structures 106 (if any) substantially intact (e.g., unremoved, unetched). Suitable selective material removal processes (e.g., masking and etching processes) are known in the art, and are not described in detail herein.

The linear gate electrodes 120 may be formed laterally adjacent exposed sidewalls of the sacrificial pillar structures 116 and the dielectric pillar structures 114 within the additional trenches 118. The linear gate electrodes 120 may laterally extend in a direction (e.g., the Y-direction) perpendicular to the direction in which the linear conductive structures 104 extend. As shown in FIG. 4, in some embodiments, each of the additional trenches 118 laterally intervening between laterally neighboring sacrificial pillar structures 116 and laterally neighboring dielectric pillar structures 114 includes two (2) of the linear gate electrodes 120 structures therein. Accordingly, the configurations of the linear gate electrodes 120 may facilitate the subsequent formation of "double-gated" transistors individually including two (2) of the linear gate electrodes 120 laterally neighboring two (2) opposing sides of a channel structure, as described in further detail below. In additional embodiments, some of the additional trenches 118 laterally intervening between laterally neighboring sacrificial pillar structures 116 and laterally neighboring dielectric pillar structures 114 includes less than two (2) of the linear gate electrodes 120 structures therein. For example, some of the additional trenches 118 may include a single (e.g., only one) linear gate electrode 120 therein, or may include no linear gate electrodes 120 therein (e.g., if a laterally neighboring additional trench 118 still includes two (2) linear gate electrodes 120 therein) to facilitate the subsequent formation of "single-gated" transistors individually includes one (1) of the linear gate electrodes 120 laterally neighboring a side of a channel structure, but does not include another one (1) of the linear gate electrodes 120 laterally neighboring an opposing side of the channel structure.

The linear gate electrodes 120 may be formed of and include at least one electrically conductive material, such as one or more of a metal, a metal alloy, a conductive metal oxide, a conductive metal nitride, a conductive metal silicide, and a conductively doped semiconductor material. The linear gate electrodes 120 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, RuTiN, and conductively doped silicon. The material composition of the linear gate electrodes 120 may be the same as or may be different than the material composition of one or more of the linear conductive structures 104 and the additional linear conductive structures 106 (if any). In at least some embodiments, the linear gate electrodes 120 are formed of and include TiN.

The linear gate electrodes 120 may each be formed at any suitable lateral dimensions (e.g., lateral dimensions in the X-direction and the Y-direction). By way of non-limiting example, each of the linear gate electrodes 120 may be formed to have a width in the X-direction within a range of from about 5 nanometers (nm) to about 15 nm, such as from about 5 nm to about 10 nm, or from about 10 nm to about 15 nm. In some embodiments, each of the linear gate electrodes 120 is formed to have a width a within a range of from about 5 nm to about 10 nm.

The linear gate electrodes 120 may be formed within the additional trenches 118 using conventional processes and conventional processing equipment, which are not described in detail herein. By way of non-limiting example, a conductive material may be conformally formed (e.g., deposited through one or more of a PVD process, a CVD process, an ALD process, and a spin-coating process) over exposed surfaces of the semiconductor device structure 100 inside and outside the additional trenches 118, and then an etching process may be performed to remove the conductive material from surfaces of the semiconductor device structure 100 outside of the additional trenches 118 and from floors of the additional trenches 118 (e.g., upper surfaces of the additional linear conductive structures 106 (if present), upper surfaces of the linear conductive structures 104) while at least partially maintaining the conductive material on the sidewalls of the sacrificial pillar structures 116 and the dielectric pillar structures 114 within the additional trenches 118 to form the linear gate electrodes 120.

Figure 5:
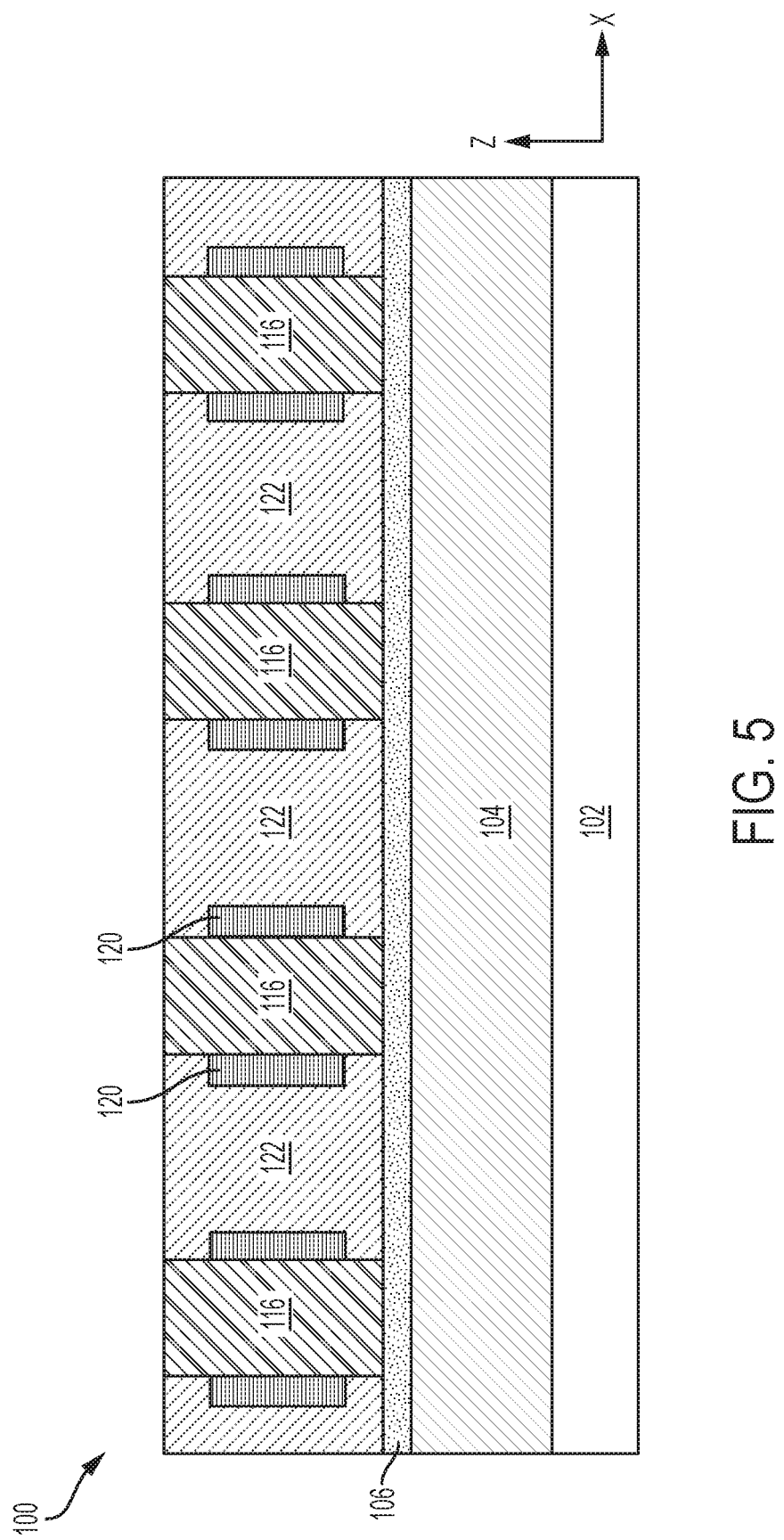

Referring next to FIG. 5, which is a partial cross-sectional view of the semiconductor device structure 100 about the line A-A shown in FIG. 4 following additional processing of the semiconductor device structure 100 beyond that described with reference to FIG. 4, isolation structures 122 may be formed within the additional trenches 118 (FIG. 4) of the semiconductor device structure 100. The isolation structures 122 may substantially fill remaining portions of the additional trenches 118 (e.g., volumes of the additional trenches 118 unoccupied by the linear gate electrodes 120), and may be substantially confined within the boundaries (e.g., vertical boundaries, lateral boundaries) of the additional trenches 118. As shown in FIG. 5, upper surfaces of the isolation structures 122 may be substantially coplanar with upper surfaces of the sacrificial pillar structures 116 and upper surfaces of the dielectric pillar structures 114.

The isolation structures 122 may be formed of and include at least one dielectric material, such as one or more of a dielectric oxide material (e.g., a silicon oxide, such as $SiO_2$; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. In some embodiments, the isolation structures 122 comprise $SiO_2$.

The isolation structures 122 may be formed using conventional processes and conventional processing equipment, which are not described in detail herein. By way of non-limiting example, a dielectric material may be non-conformally formed (e.g., deposited) over exposed surfaces of the semiconductor device structure 100 inside and outside of the additional trenches 118 (FIG. 4), and then portions of dielectric material outside of the additional trenches 118 may be removed through at least one planarization process, such as a conventional CMP process.

Figure 6:
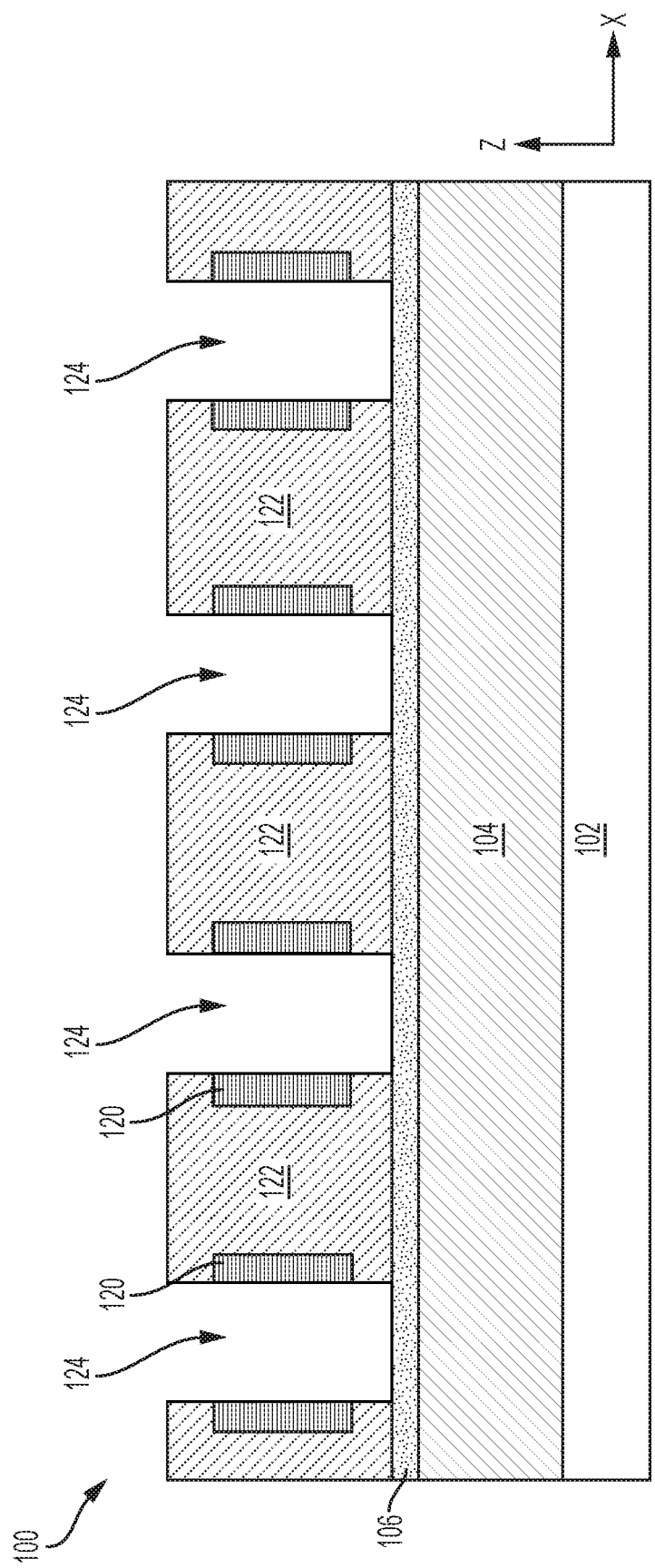

Referring next to FIG. 6, the sacrificial pillar structures 116 (FIG. 5) are selectively removed to form openings 124 (e.g., apertures, vias). As shown in FIG. 6, the openings 124 may be located laterally adjacent the linear gate electrodes 120. The geometric configurations (e.g., shapes, dimensions) of the openings 124 may substantially correspond to (e.g., be substantially the same as) the geometric configurations of the sacrificial pillar structures 116 (FIG. 5). Lateral boundaries of the openings 124 may be at least partially defined by side surfaces of the linear gate electrodes 120, the isolation structures 122, and the dielectric pillar structures 114 (FIG. 4); and lower vertical boundaries of the openings 124 may be at least partially defined by upper surfaces of the additional linear conductive structures 106 (if present) or upper surfaces of the linear conductive structures 104.

The sacrificial pillar structures 116 (FIG. 5) may be selectively removed relative to the other components of the semiconductor device structure 100 (e.g., the dielectric pillar structures 114, the linear gate electrodes 120, the isolation structures 122, the linear conductive structures 104, the additional linear conductive structures 106 (if any), the first barrier structure 102) using conventional material removal processes (e.g., conventional etching processes, such as one or more of a conventional wet etching process and a conventional dry etching process), which are not described in detail herein.

Figure 7:
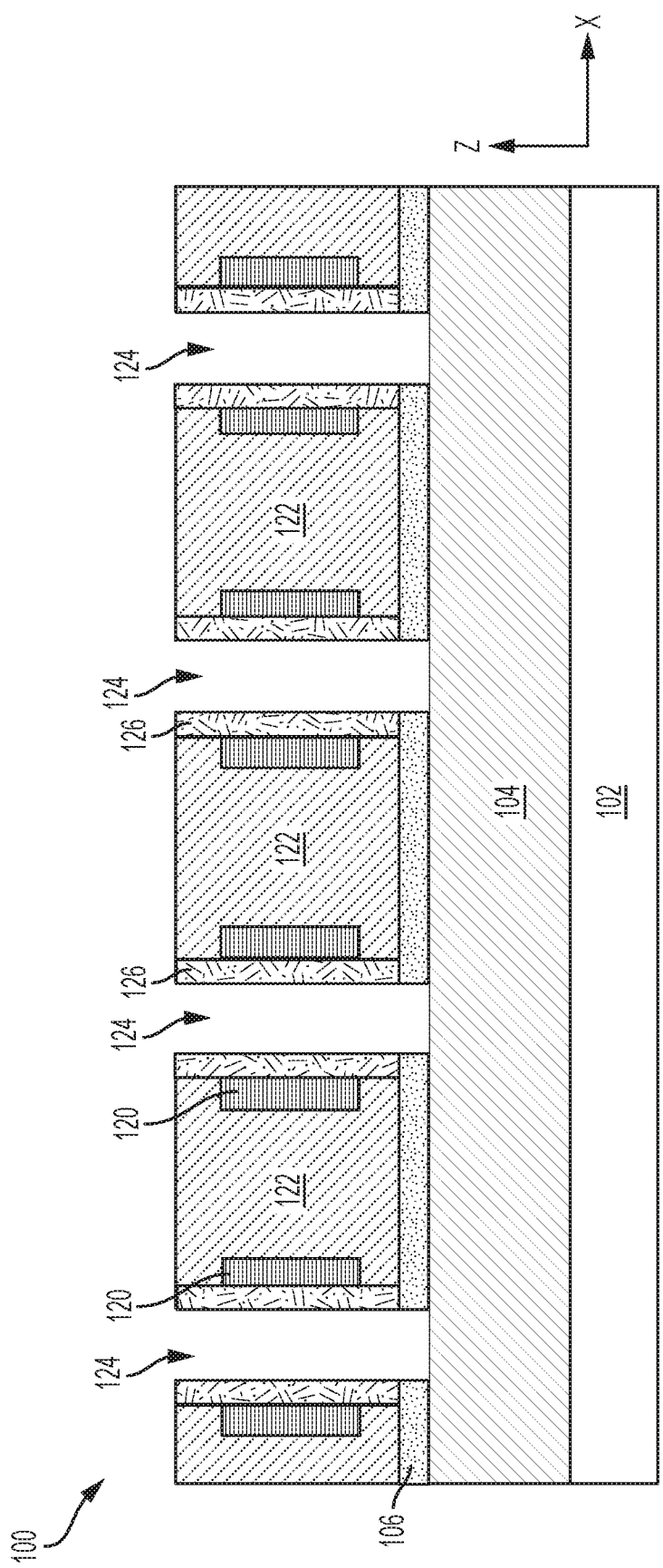

Referring next to FIG. 7, dielectric liner structures 126 (e.g., gate dielectric structures) are formed within the openings 124. As shown in FIG. 7, the dielectric liner structures 126 partially fill the openings 124. Within the openings 124, the dielectric liner structures 126 are positioned laterally adjacent side surfaces of the linear gate electrodes 120, the isolation structures 122, and the dielectric pillar structures 114 (FIG. 4). Central portions of floors of the openings 124 may be free of the dielectric liner structures 126. In addition, if present, portions of the additional linear conductive structures 106 underlying the trenches and not covered by the dielectric liner structures 126 may be selectively removed to expose upper surfaces of the linear conductive structures 104.

The dielectric liner structures 126 may be formed of and include at least one dielectric material (e.g., at least one dielectric oxide material), such as one or more of $SiO_2$, phosphosilicate glass, borosilicate glass, borophosphosilicate glass, fluorosilicate glass, aluminum oxide, and a high-k oxide (e.g., hafnium oxide ($HfO_x$), niobium oxide ($NbO_x$), titanium oxide ($TiO_x$)). In some embodiments, the dielectric liner structures 126 are formed of and include $SiO_2$.

The dimensions of dielectric liner structures 126 (and, hence, the dimensions remaining portions of the openings 124) may be selected to provide desired dimensions and spacing to additional structures to be formed in the remaining portions of the openings 124. The dielectric liner structures 126 may, for example, be laterally sized (e.g., in the X-direction) to facilitate the formation of channel structures exhibiting desired lateral dimensions and desired lateral spacing, as described in further detail below. By way of non-limiting example, each of the dielectric liner structures 126 may be formed to have a lateral width of the dielectric material thereof that is less than or equal to about 20 nm, such as less than or equal to about 10 nm, or less than or equal to about 5 nm. In some embodiments, each of the dielectric liner structures 126 is formed to have a lateral width of the dielectric material thereof within a range of from about 5 nm to about 10 nm.

The dielectric liner structures 126 may be formed using conventional processes and conventional processing equipment, which are not described in detail herein. By way of non-limiting example, a dielectric material (e.g., a dielectric oxide material) may be conformally formed (e.g., deposited through one or more of a PVD process, a CVD process, an ALD process, and a spin-coating process) over exposed surfaces of the semiconductor device structure 100 inside and outside of the openings 124, and then an anisotropic etching process may be performed to remove the dielectric material from surfaces of the semiconductor device structure 100 outside of the openings 124 and from portions of upper surfaces of the additional linear conductive structures 106 (if present) or the linear conductive structures 104 (e.g., if the additional linear conductive structures 106 are absent) underlying central portions of the openings 124, while maintaining the dielectric material on side surfaces of the linear gate electrodes 120, the isolation structures 122, and the dielectric pillar structures 114 (FIG. 4) to form the dielectric liner structures 126. In addition, if the additional linear conductive structures 106 are present, portions thereof remaining uncovered by the dielectric liner structures 126 may be selectively removed (e.g., through at least one additional material removal process) to vertically extend the openings 124 and expose upper surfaces of the linear conductive structures 104.

Figure 8A:
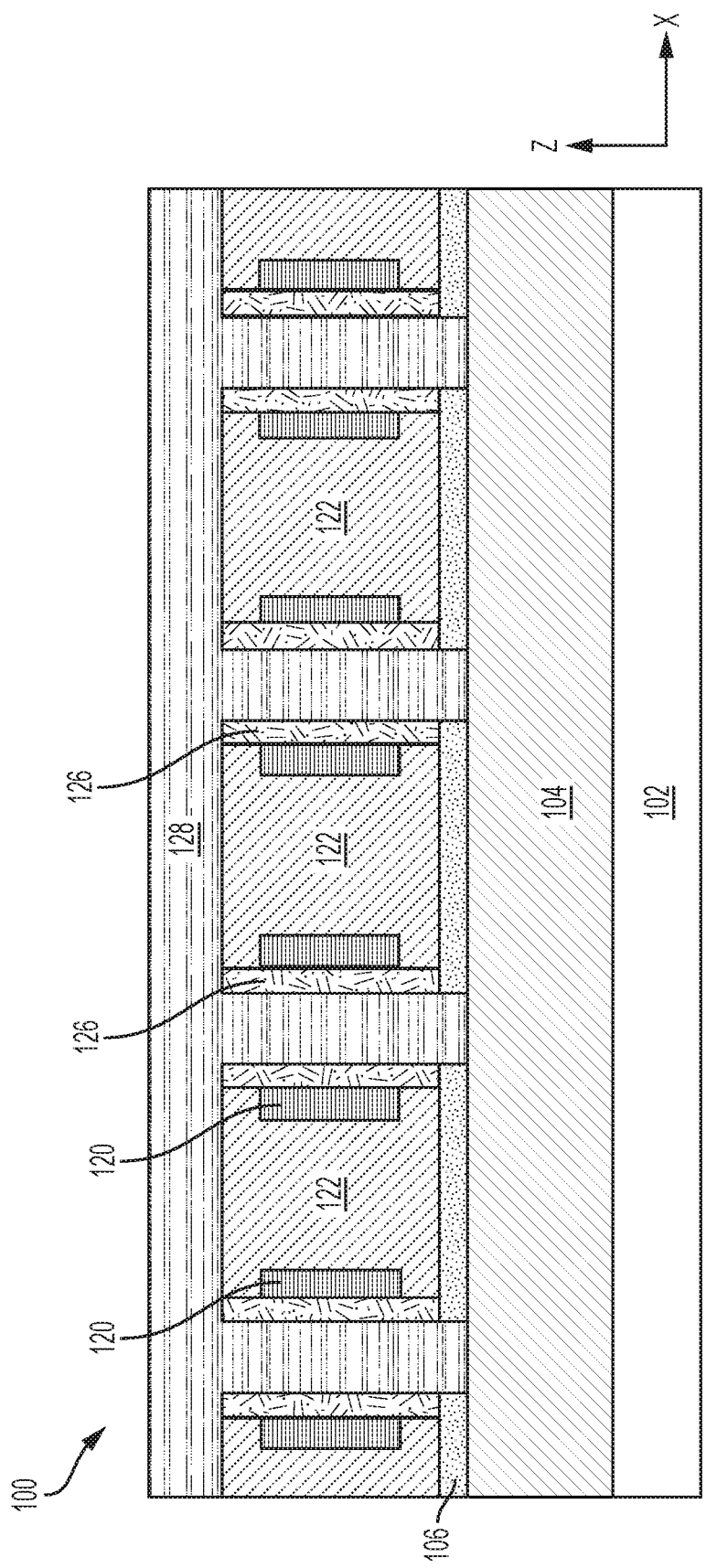

Referring next to FIG. 8A, a channel material 128 may be formed over surfaces of the semiconductor device structure 100 inside and outside of the openings 124 (FIG. 7). The channel material 128 may substantially fill remaining (e.g., unfilled) portions of the openings 124 (FIG. 7). As shown in FIG. 8A, within the boundaries (e.g., vertical boundaries, lateral boundaries) previously occupied by the openings 124 (FIG. 7), the channel material 128 may be located laterally adjacent the dielectric liner structures 126 and the additional linear conductive structures 106 (if present), and may be located on or over the linear conductive structures 104.

The channel material 128 may be formed of and include at least one semiconductive material including at least one region having a band gap larger than that polycrystalline silicon, such as a band gap larger than 1.65 electronvolts (eV). For example, the channel material 128 may comprise an oxide semiconductor material including one or more (e.g., one, two or more, three or more) of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_x$-$Ga_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the channel material 128 may comprise one or more stoichiometric compounds and/or one or more non-stoichiometric compounds throughout the different regions thereof, and values of "x," "y," "z," and "a" may be integers or may be non-integers throughout the different regions thereof. As used herein, the term "non-stoichiometric compound" means and includes a chemical compound with an elemental composition that cannot be represented by a ratio of well-defined natural numbers and is in violation of the law of definite proportions.

The channel material 128 may be substantially homogeneous or may be heterogeneous. In some embodiments, the channel material 128 is substantially homogeneous, such that the channel material 128 exhibits a substantially uniform (e.g., even, non-variable) distribution of the elements thereof. For example, amounts (e.g., atomic concentrations) of each element (e.g., one or more metals, one or more metalloids, oxygen) included in the channel material 128 may not vary throughout the dimensions (e.g., lateral dimensions, vertical dimensions) of the channel material 128. In additional embodiments, the channel material 128 is substantially heterogeneous, such that the channel material 128 exhibits a substantially non-uniform (e.g., non-even, variable) distribution of one or more of the elements thereof. For example, amounts (e.g., atomic concentrations) of one or more elements (e.g., one or more metals, one or more metalloids, oxygen) included in the channel material 128 may vary throughout dimensions of the channel material 128.

Figure 8B:
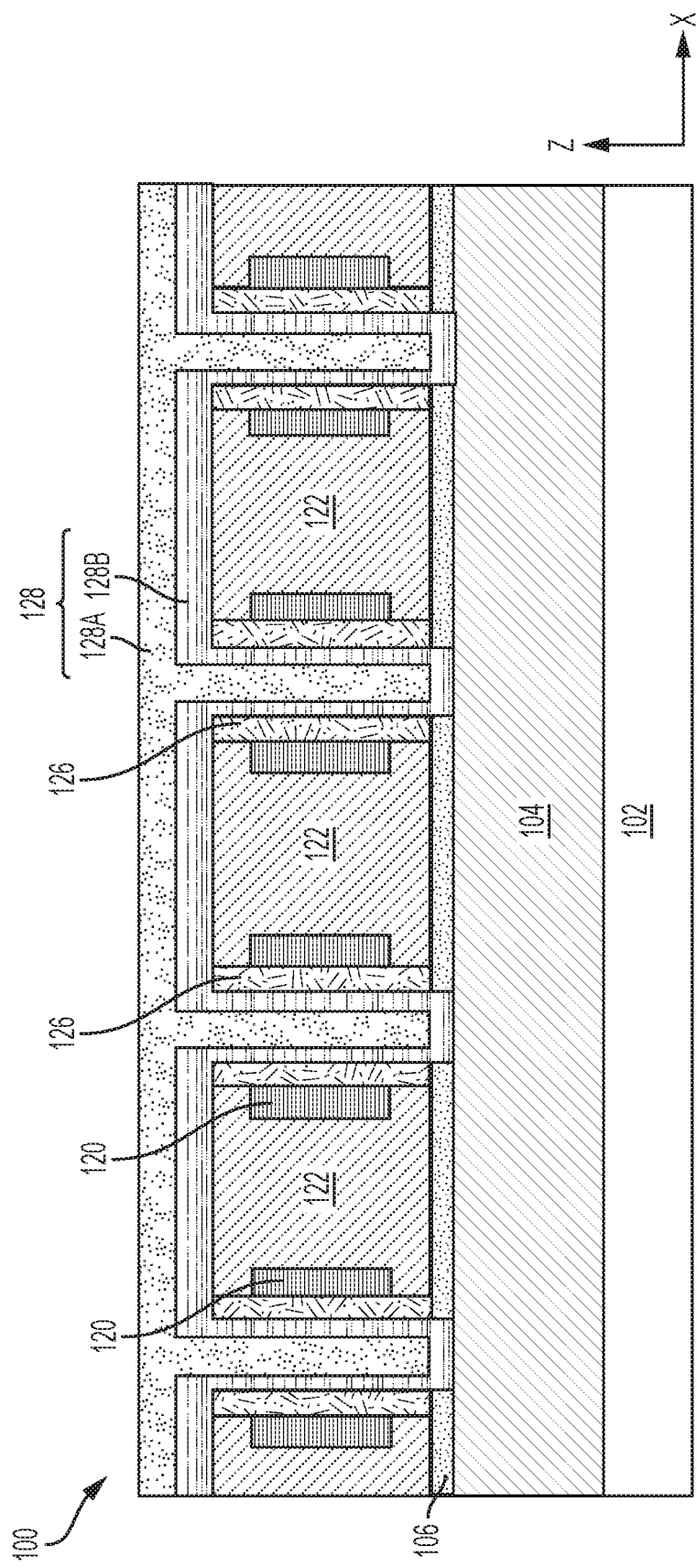

FIG. 8B illustrates a non-limiting example of a heterogeneous form of the channel material 128. As shown in FIG. 8B, the channel material 128 may include a first region 128A having a first material composition and a first material distribution, and a second region 128B having one or more of a different material composition and a different material distribution than the first region 128A. The first region 128A may overlie the second region 128B, and the second region may overlie surfaces (e.g., upper surfaces, side surfaces) of the linear conductive structures 104, the additional linear conductive structures 106 (if any), the dielectric liner structures 126, the isolation structures 122, and the dielectric pillar structures 114 (FIG. 4). The first region 128A and the second region 128B may include substantially the same elements as one another, or may include one or more different elements than one another. In some embodiments, the first region 128A and the second region 128B of the channel material 128 include substantially the same elements as one another, but the first region 128A and the second region 128B include different atomic concentrations of one or more of the elements than one another. For example, the channel material 128 may comprise a heterogeneous form of a single (e.g., only one) oxide semiconductor material (e.g., only one of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_x$-$ON_z$, $Mg_xZn_yO$, $In_xZn_yO$, $In_xGa_yZn_zO$, $Zr_xIn_yZn_zO$, $Hf_x$-$In_yZn_zO$, $Sn_xIn_yZn_zO$, $Al_xSn_yIn_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_x$-$Ga_ySi_zO$), but atomic concentrations of one or more elements of the single oxide semiconductor material (and, hence, the relative atomic ratios of the formula thereof) may be different in the first region 128A and the second region 128B. In additional embodiments, the first region 128A and the second region 128B of the channel material 128 include one or more different elements than one another. For example, the first region 128A and the second region 128B may comprise different oxide semiconductor materials (e.g., different oxide semiconductor materials selected from $Zn_xSn_yO$, $In_xZn_yO$, $Zn_xO$, $In_xGa_yZn_zO$, $In_xGa_ySi_zO_a$, $In_xO$, $Sn_xO$, $In_xW_yO$, $Ti_xO$, $Zn_xON_z$, $Mg_xZn_yO$, $In_xZn_yO$, $In_x$-$Ga_yZn_zO$, $Zr_xIn_yZn_zO$, $Hf_xIn_yZn_zO$, $Sn_xIn_yZn_zO$, $Al_xSn_y$-$In_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_xGa_ySi_zO$) than one another.

With returned reference to FIG. 8A, the channel material 128 may be formed using conventional processes (e.g., conventional deposition processes, conventional material removal processes), which are not described in detail herein. By way of non-limiting example, the channel material 128 may be deposited (e.g., through one or more of an ALD process, a CVD process, a PECVD process, a PVD process, and a spin-coating process) over exposed surfaces of the linear conductive structures 104, the additional linear conductive structures 106 (if any), the dielectric liner structures 126, the isolation structures 122, and the dielectric pillar structures 114 (FIG. 4).

Figure 9:
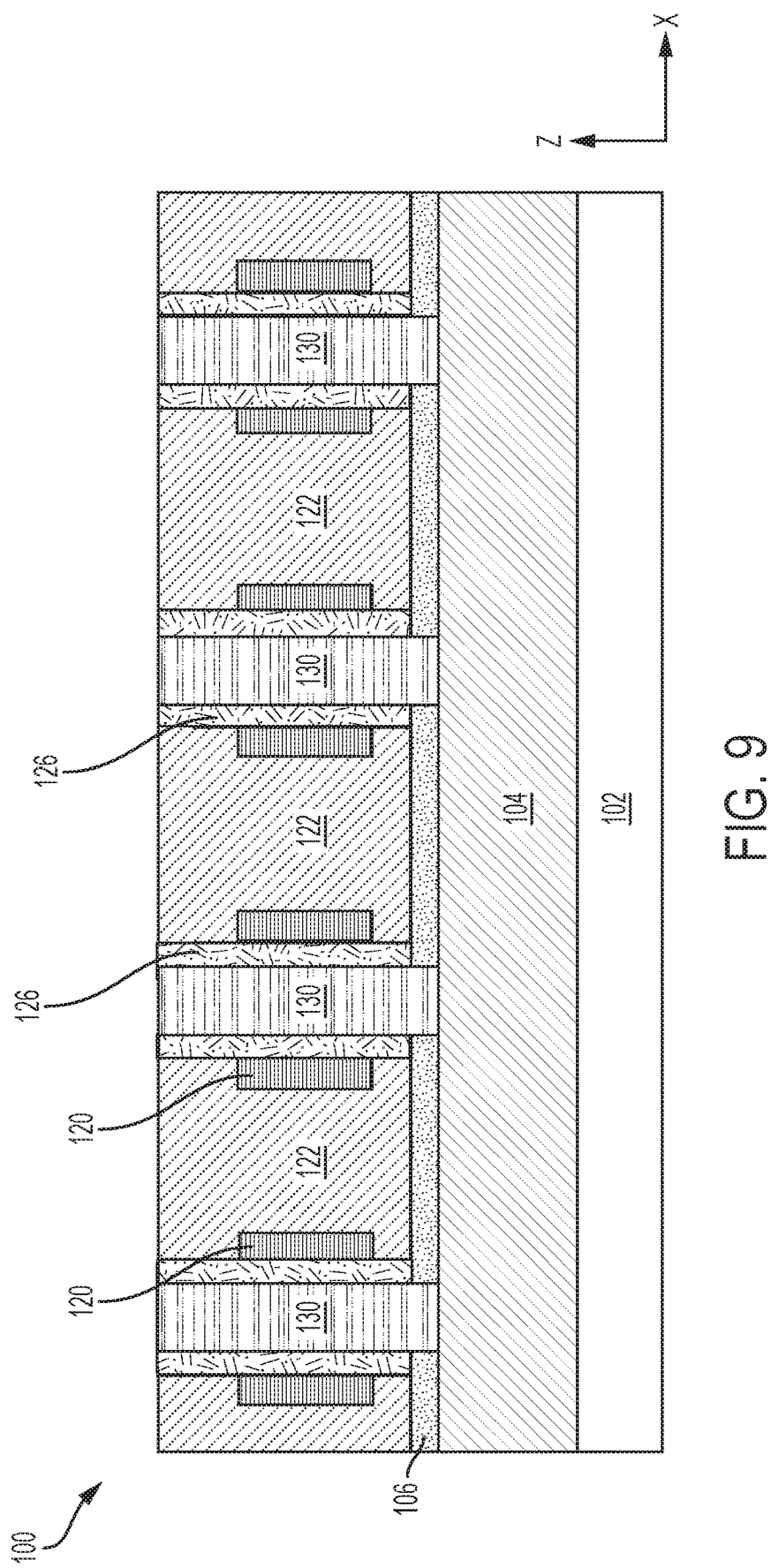

Referring next to FIG. 9, upper portions of the channel material 128 (FIG. 8A) may be removed to form channel structures 130 (e.g., vertical channel structures, channel pillars). Portions of the channel material 128 (FIG. 8A) outside of the boundaries (e.g., vertical boundaries, lateral boundaries) of the openings 124 (FIG. 7) may be removed. By way of non-limiting example, the upper portions of the channel material 128 (FIG. 8A) may be removed through one or more of a planarization process (e.g., a CMP process) and a blanket dry etching process. The channel structures 130 may be annealed at a temperature greater than or equal to about 200° C. following the material removal process. Uppermost surfaces (e.g., in the Z-direction) of the channel structures 130 may be substantially coplanar with uppermost surfaces of the dielectric liner structures 126, the isolation structures 122, and the dielectric pillar structures 114 (FIG. 4).

Figure 10:
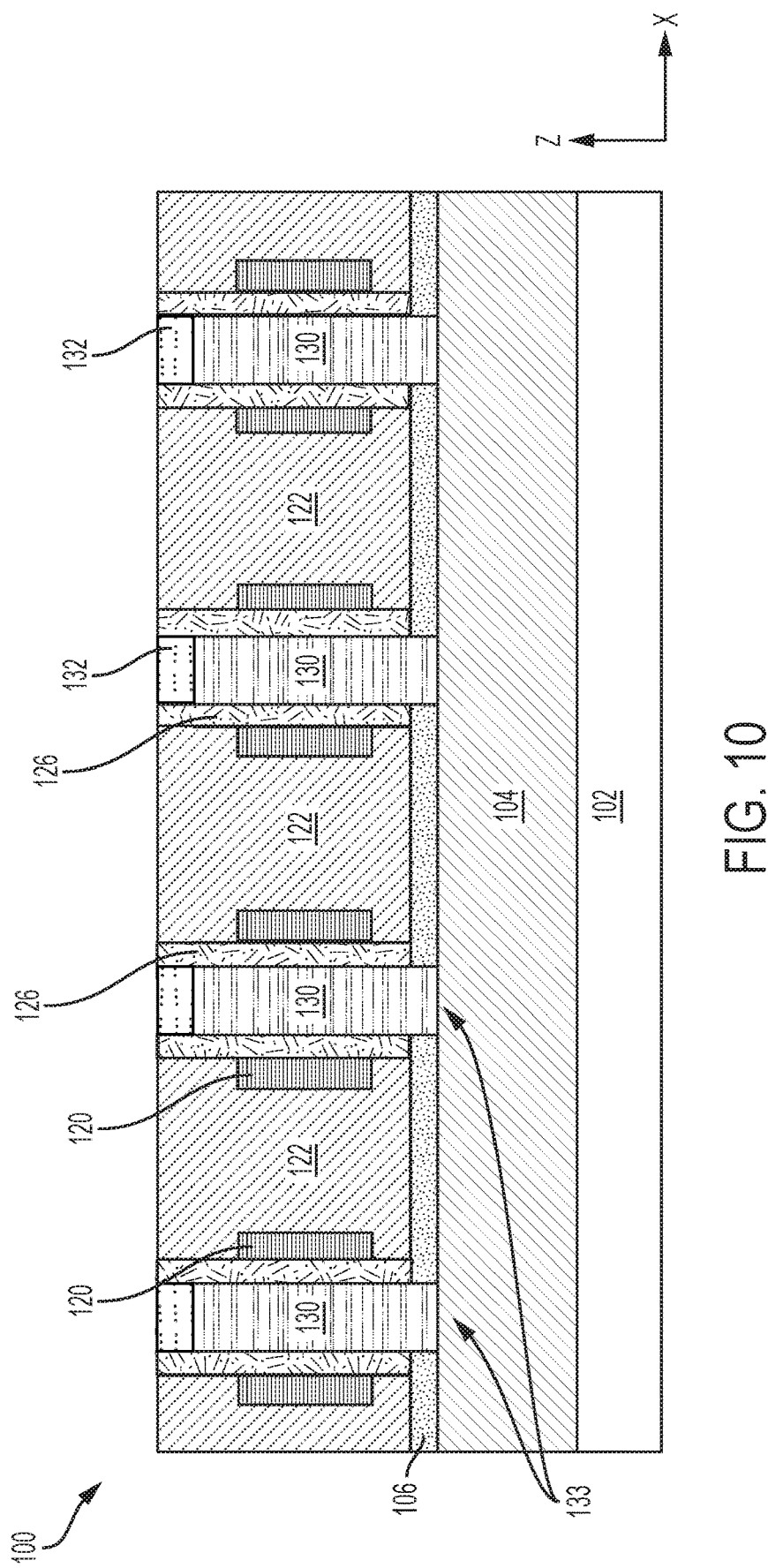

Referring next to FIG. 10, the channel structures 130 may be vertically recessed (e.g., upper portions of the channel structures 130 may be removed), and then conductive contacts 132 may be formed on remaining portions of the channel structures 130. As shown in FIG. 10, the conductive contacts 132 may be located laterally adjacent the dielectric liner structures 126. In addition, uppermost surfaces (e.g., in the Z-direction) of the conductive contacts 132 may be substantially coplanar with uppermost surfaces of the dielectric liner structures 126, the isolation structures 122, and the dielectric pillar structures 114 (FIG. 4).

The conductive contacts 132 may be formed of and include at least one electrically conductive material, such as one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, RuTiN, and conductively doped silicon. The material composition of the conductive contacts 132 may be the same as or may be different than the material composition of one or more of the linear conductive structures 104, the additional linear conductive structures 106 (if any), and the linear gate electrodes 120. In some embodiments, the conductive contacts 132 are formed of and include Ru. In additional embodiments, the conductive contacts 132 are formed of and include Mo.

The channel structures 130 may be vertically recessed and the conductive contacts 132 may be formed in the resulting recesses using conventional processes, which are not described in detail herein. By way of non-limiting example, the channel structures 130 may be exposed to a wet etchant (e.g., HCl) to remove upper portions thereof to form recesses at least partially defined by side surfaces of the dielectric liner structures 126. Thereafter, a conductive material may be formed (e.g., through one or more conventional deposition processes, such as one or more of an ALD process, a CVD process, a PECVD process, a PVD process, and a spin-coating process) on or over surfaces of the semiconductor device structure 100 inside and outside of the recesses. Portions of the conductive material outside of the recesses may then be removed (e.g., by way of at least one planarization process, such as a CMP process) to form the conductive contacts 132.

With continued reference to FIG. 10, the semiconductor device structure 100 at the processing stage depicted in FIG. 10 includes multiple vertical transistors 133 (e.g., vertical thin film transistors (TFTs)). The vertical transistors 133 each individually include one of the channel structures 130, one of the conductive contacts 132, two of the linear gate electrodes 120 laterally flanking the channel structure 130, and portions of the dielectric liner structures 126 laterally intervening between the channel structure 130 and each of the two linear gate electrodes 120. Thus, each vertical transistor 133 may be considered to be "double-gated" since two of the linear gate electrodes 120 laterally-neighbor two opposing sides of the channel structure 130 of the vertical transistor 133. As previously discussed, in accordance with additional embodiments of the disclosure, the vertical transistors 133 may be formed to exhibit a different configuration (e.g., a configuration other than a "double-gated" configuration). As a non-limiting example, the vertical transistors 133 may be formed to exhibit a "single-gate" configuration wherein each vertical transistor 133 individually includes one of the linear gate electrodes 120 laterally neighboring a side of the channel structure 130, but does not include one of the linear gate electrodes 120 laterally neighboring an opposing side of the channel structure 130. For example, one of the isolation structures 122 may laterally-neighbor the opposing side of the channel structure 130 in place of the second linear gate electrode 120.

Thus, in accordance with embodiments of the disclosure, a method of forming a device comprises forming sacrificial pillar structures over conductive structures overlying a barrier structure substantially impermeable to hydrogen. The sacrificial pillar structures are separated from one another by trenches linearly extending in a first lateral direction orthogonal to a second lateral direction in which the conductive structures linearly extend. Gate electrodes are formed within the trenches and laterally adjacent sidewalls of the sacrificial pillar structures. The sacrificial pillar structures are removed to form openings between the gate electrodes. Dielectric liner structures are formed within the openings and laterally adjacent sidewalls of the gate electrodes. Channel structures are formed within the openings after forming the dielectric liner structures. The channel structures comprise a semiconductive material having a band gap larger than that of polycrystalline silicon. Conductive contacts are formed on the channel structures.

Figure 11:
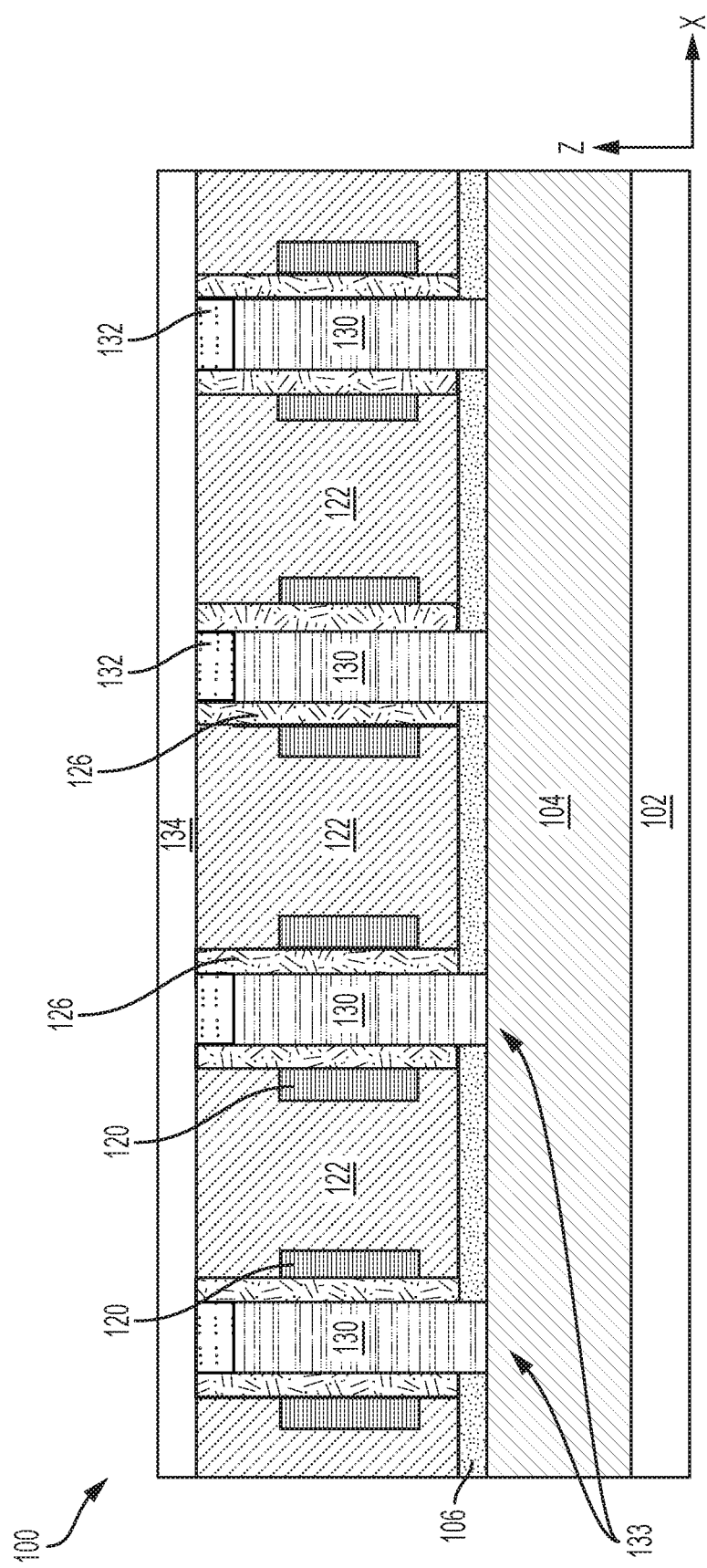

Referring next to FIG. 11, a second barrier structure 134 may be formed on or over upper surfaces of the dielectric liner structures 126, conductive contacts 132, the isolation structures 122, and the dielectric pillar structures 114 (FIG. 4). The second barrier structure 134 may be formed of and include at least one dielectric material substantially impermeable to hydrogen. The second barrier structure 134 may substantially impede (e.g., prevent) diffusion of hydrogen therethrough, such as, for example, during subsequent hydrogen annealing of the semiconductor device structure 100. By way of non-limiting example, the second barrier structure 134 may comprise one or more of $AlO_x$, $AlO_xN_y$, $AlSi_xN_y$, $AlSi_xO_yN_z$, $BN_x$, $BC_xN_y$, $SiC_x$, $SiC_xN_y$, and $SiN_x$. A material composition of the second barrier structure 134 may be substantially the same as or may be different than the material composition of the first barrier structure 102. In some embodiments, the second barrier structure 134 comprises $AlO_x$.

Thus, in accordance with embodiments of the disclosure, a device comprises a first barrier structure, conductive line structures, channel pillars, dielectric liner structures, gate electrodes, conductive contacts, and a second barrier structure. The first barrier structure is substantially impermeable to hydrogen. The conductive line structures overlie the first barrier structure and laterally extend in a first direction. The channel pillars overlie the conductive line structures and each comprise a semiconductive material having a band gap larger than that of polycrystalline silicon. The dielectric liner structures substantially laterally surrounding sidewalls of the channel pillars. The gate electrodes are laterally adjacent outer sidewalls of the dielectric liner structures and laterally extend in a second direction substantially perpendicular to the first direction. The conductive contacts overlie the channel pillars. The second barrier structure is substantially impermeable to hydrogen and overlies and laterally extends across upper surfaces of the dielectric liner structures and the gate electrodes.

Figure 12:
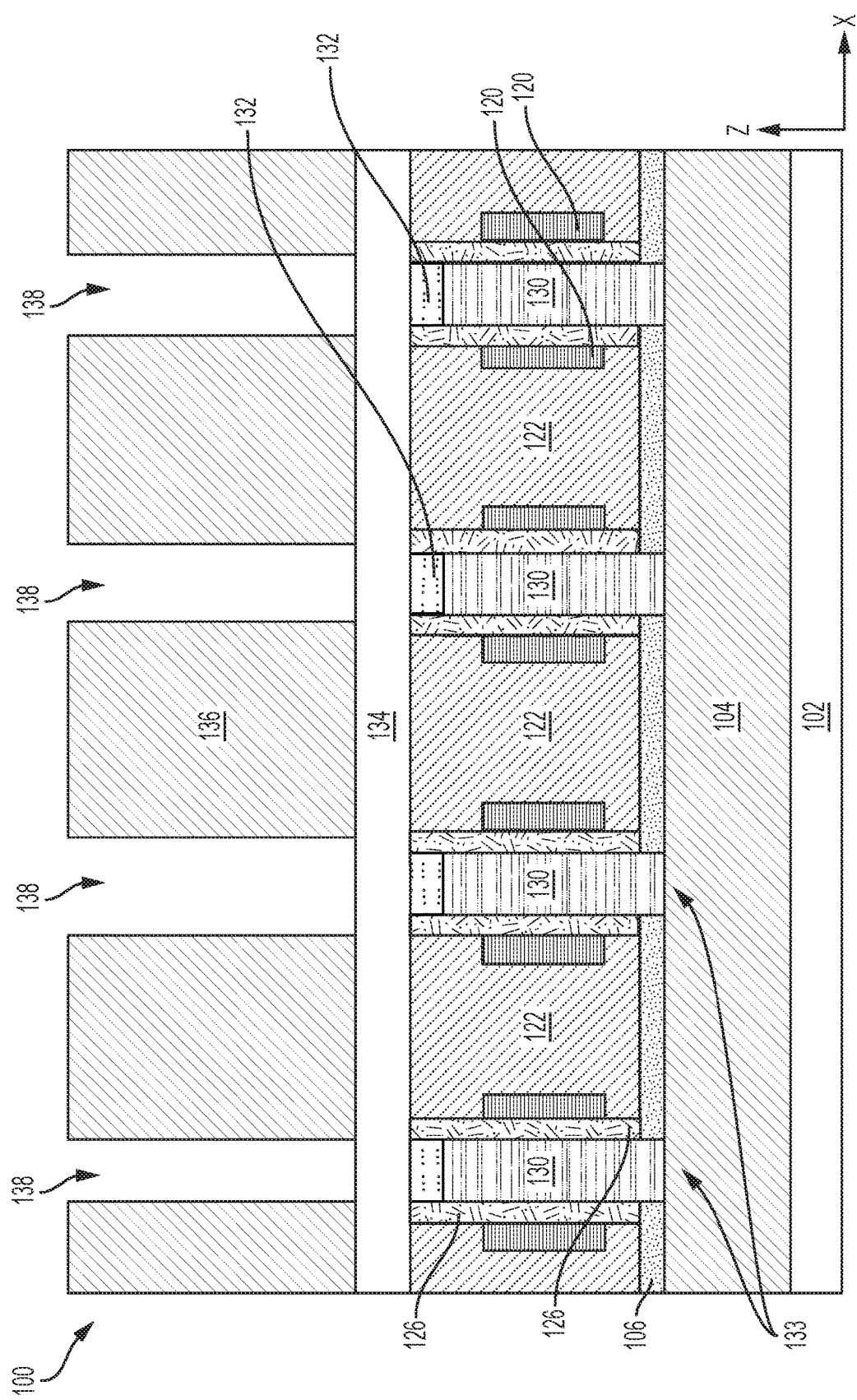

Referring next to FIG. 12, a dielectric material 136 may be formed on or over the second barrier structure 134, and then apertures 138 may be formed in the dielectric material 136. As shown in FIG. 12, the apertures 138 may vertically extend from an upper surface of the dielectric material 136 to an upper surface of the second barrier structure 134. In addition, the apertures 138 may be substantially laterally aligned with the conductive contacts 132 and the channel structures 130 of the vertical transistors 133 thereunder. In some embodiments, lateral dimensions of the apertures 138 are substantially the same as lateral dimensions of the conductive contacts 132 and the channel structures 130. In additional embodiments, lateral dimensions of the apertures 138 are different than (e.g., greater than, less than) the lateral dimensions of the conductive contacts 132 and the channel structures 130.

The dielectric material 136 may comprise one or more of a dielectric oxide material (e.g., a silicon oxide, such as $SiO_2$; phosphosilicate glass; borosilicate glass; borophosphosilicate glass; fluorosilicate glass; aluminum oxide; high-k oxides, such as $HfO_x$; a combination thereof), a dielectric nitride material (e.g., SiN, a dielectric oxynitride material (e.g., SiON), a dielectric carbonitride material (e.g., SiCN), and a dielectric carboxynitride material (e.g., SiOCN), and amphorous carbon. In some embodiments, the dielectric material 136 comprises Sift. The dielectric material 136 may be formed using conventional processes (e.g., conventional deposition processes), which are not described in detail herein. By way of non-limiting example, the dielectric material 136 be deposited (e.g., through one or more of an ALD process, a CVD process, a PECVD process, a PVD process, and a spin-coating process) on or over an upper surface of the second barrier structure 134.

In addition, the apertures 138 may be formed in the dielectric material using conventional processes (e.g., conventional masking and patterning processes, conventional material removal processes), which are also not described in detail herein. For example, a mask structure having a desired pattern to be transferred into the dielectric material 136 may be provided over the dielectric material 136, and then at least one anisotropic etching process (e.g., an anisotropic dry etching process, such as one or more of reactive ion etching (RIE), deep RIE, plasma etching, reactive ion beam etching, chemically assisted ion beam etching; anisotropic wet etching process, such as one or more of hydrofluoric acid (HF) etching, buffered HF etching, and buffered oxide etching) may be performed to form the apertures 138.

Figure 13:
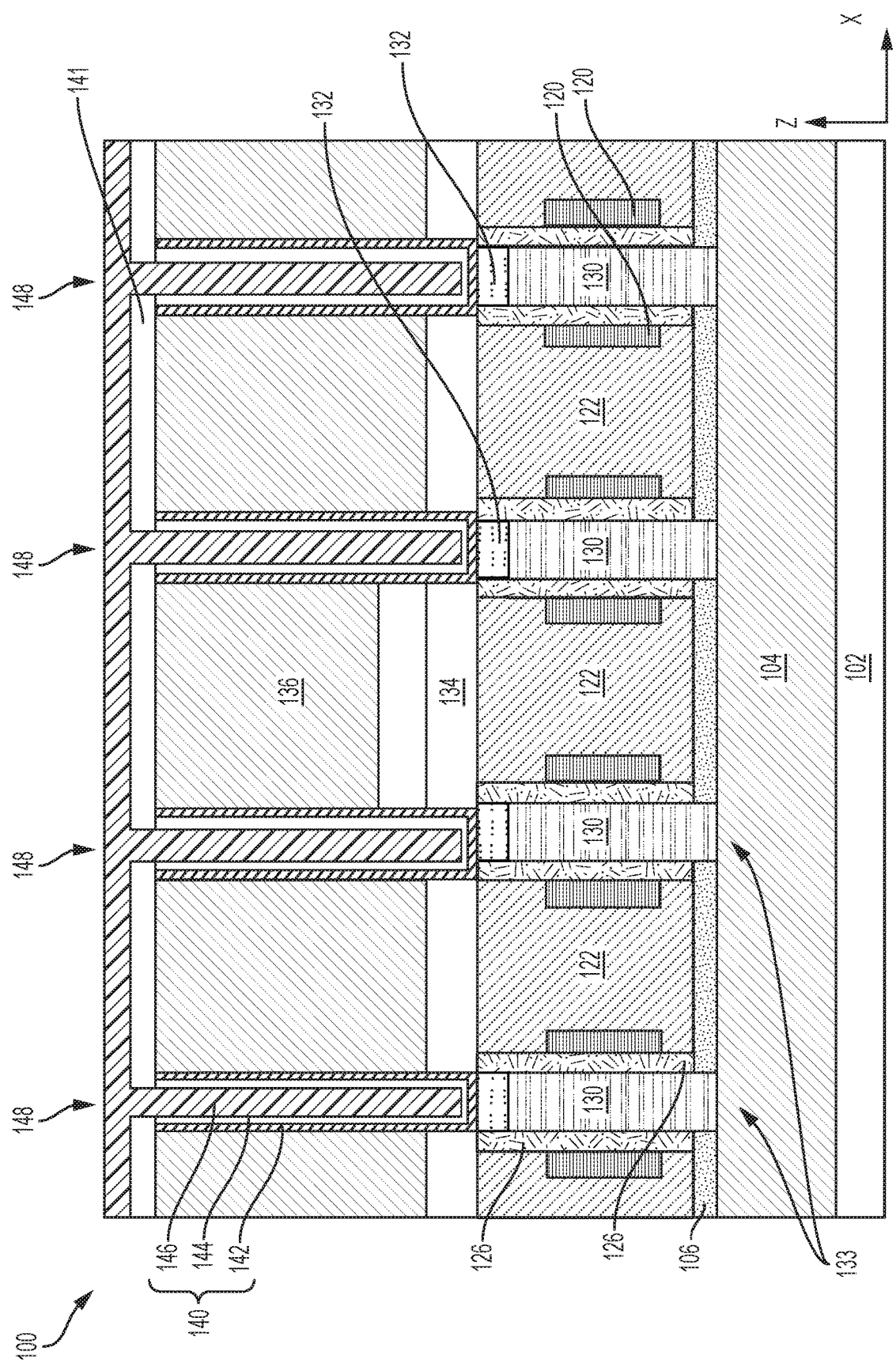

Referring next to FIG. 13, the apertures 138 (FIG. 12) are vertically extended (e.g., in the Z-direction) through the second barrier structure 134 to expose upper surfaces of the conductive contacts 132, and then capacitors 140 are formed within the apertures 138 (FIG. 12) and in contact with the conductive contacts 132. In addition, a third barrier structure 141 may be formed on or over portions of the dielectric material 136 and the capacitors 140. The capacitors 140 and the vertical transistors 133 thereunder form memory cells 148 (e.g., FeRAM cells, DRAM cells) of the semiconductor device structure 100.

The apertures 138 (FIG. 12) may be vertically extended through the second barrier structure 134 using conventional material removal processes, which are not described in detail herein. By way of non-limiting example, the apertures 138 (FIG. 12) may be vertically extended through the second barrier structure 134 through one or more of an anisotropic dry etching process (e.g., RIE, deep RIE, plasma etching, reactive ion beam etching, chemically assisted ion beam etching) and an anisotropic wet etching process (e.g., HF etching, buffered HF etching, and buffered oxide etching).

The capacitors 140 may comprise any structures able to store a charge representative of a programmable logic state. By way of non-limiting example, as shown in FIG. 13, the capacitors 140 may comprise ferroelectric capacitors including a first electrode 142 (e.g., a lower electrode), a second electrode 146 (e.g., an upper electrode), and a dielectric structure 144 between the first electrode 142 and the second electrode 146. The first electrode 142 and the second electrode 146 may each individually comprise at least one electrically conductive material (e.g., one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, RuTiN, and conductively doped silicon). The dielectric structure 144 may, for example, comprise a high dielectric constant (HDC) dielectric material (e.g., a dielectric material having a dielectric constant greater than or equal to about 20), such as one or more of barium strontium titanate (BST), lead ziconate titanate (PZT), lead lanthanum zirconate titanate (PLZT), lead scandium tantalate (PST), strontium bismuth tantalate (SBT), barium bismuth tantalate (BBT), barium titanate (BT), strontium titanate (ST), and tantalum pentoxide ($Ta_2O_5$).

The third barrier structure 141 may be formed of and include at least one dielectric material substantially impermeable to hydrogen. The third barrier structure 141 may substantially impede (e.g., prevent) diffusion of hydrogen therethrough, such as, for example, during subsequent hydrogen annealing of the semiconductor device structure 100. By way of non-limiting example, the third barrier structure 141 may comprise one or more of $AlO_x$, $AlO_xN_y$, $AlSi_xN_y$, $AlSi_xO_yN_z$, $BN_x$, $BC_xN_y$, $SiC_x$, $SiC_xN_y$, and $SiN_x$. A material composition of the third barrier structure 141 may be substantially the same as or may be different than a material composition of one or more (e.g., each) of the first barrier structure 102 and the second barrier structure 134. In some embodiments, the third barrier structure 141 comprises $AlO_x$.

The capacitors 140 and the third barrier structure 141 may be formed using conventional processes (e.g., conventional deposition processes, conventional material removal processes), which are not described in detail herein. By way of non-limiting example, if the capacitors 140 comprise ferroelectric capacitors, following the vertical extension of the apertures 138 (FIG. 12), a first electrically conductive material may be conformally formed (e.g., conformally deposited through one or more of a PVD process, a CVD process, a PECVD process, an ALD process, and a spin-coating process) over exposed surfaces of the semiconductor device structure 100 inside and outside of the apertures 138 (FIG. 12), and a dielectric material may be formed (e.g., non-conformally formed, such as non-conformally deposited) on or over surfaces of the first conductive material inside and outside remainders of the apertures 138 (FIG. 12). The first conductive material and the dielectric material may substantially fill the apertures 138 (FIG. 12). Portions of the first conductive material and the dielectric material outside of the apertures (FIG. 12) may then by removed (e.g., using at least one planarization process, such as at least one CMP process) to form the first electrodes 142. Thereafter, another dielectric material may be formed (e.g., deposited through one or more of an ALD process, a CVD process, a PECVD process, a PVD process, and a spin-coating process) on or over exposed surfaces of the semiconductor device structure 100 to form the third barrier structure 141. Portions of the third barrier structure 141 and the dielectric material thereunder may then be removed (e.g., anisotropically etched using a mask) to form additional apertures and the dielectric structures 144. A second electrically conductive material may then be formed (e.g., non-conformally formed, such as non-conformally deposited) on or over surfaces of the semiconductor device structure 100 inside and outside of the additional apertures to form the second electrodes 146. The second electrically conductive material may substantially fill the additional apertures.

Figure 14:
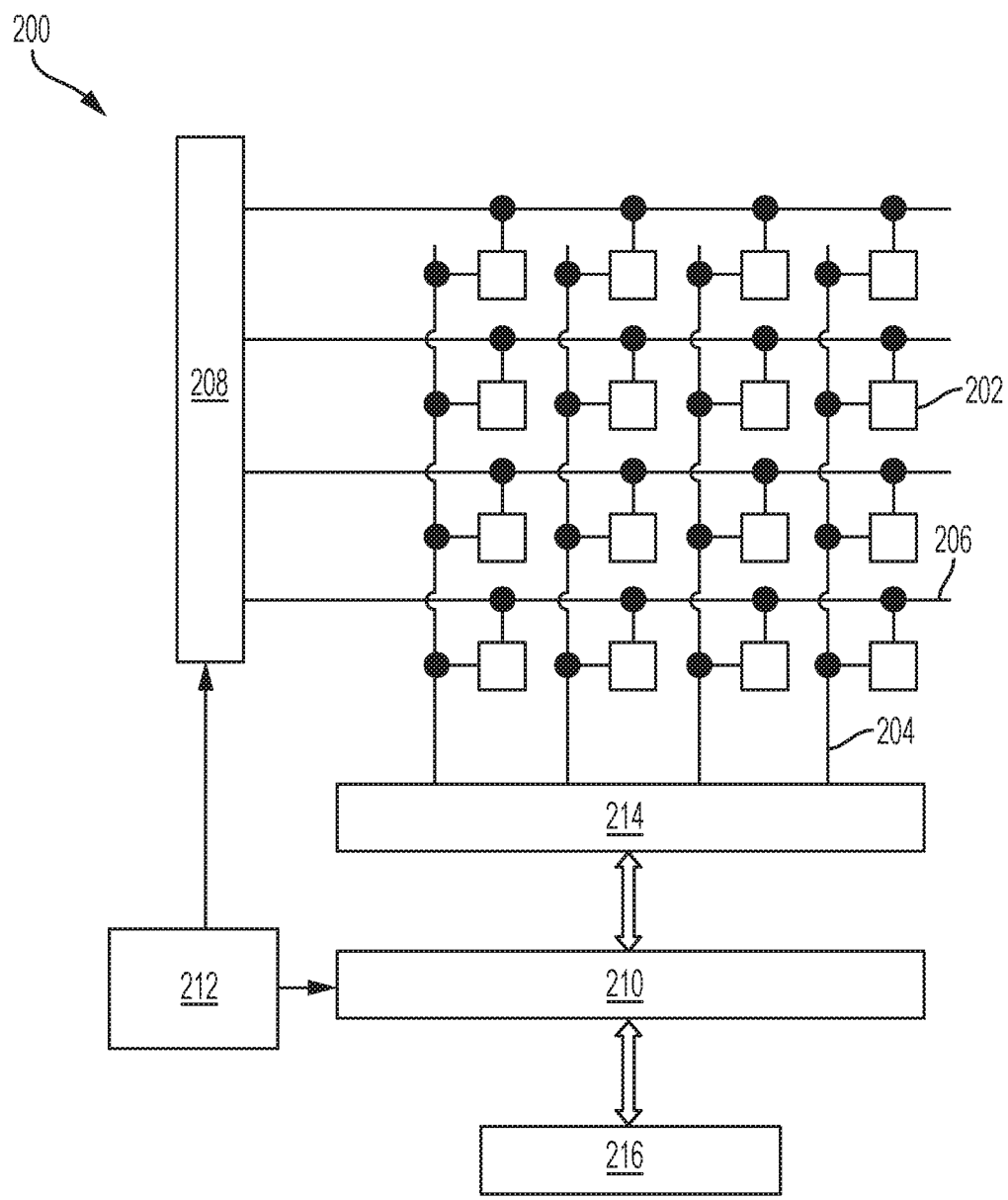
FIG. 14 is a functional block diagram of a memory device, in accordance with an embodiment of the disclosure.

FIG. 14 illustrates a functional block diagram of a memory device 200, in accordance with an embodiment of the disclosure. The memory device 200 may include, for example, an embodiment of the semiconductor device structure 100 previously described herein. As shown in FIG. 14, the memory device 200 may include memory cells 202 (e.g., the memory cells 148 (FIG. 13)), digit lines 204 (e.g., the linear conductive structures 104 (FIG. 13)), word lines 206 (e.g., the linear gate electrodes 120 (FIG. 13)), a row decoder 208, a column decoder 210, a memory controller 212, a sense device 214, and an input/output device 216.

The memory cells 202 of the memory device 200 are programmable to at least two different logic states (e.g., logic 0 and logic 1). Each memory cell 202 may individually include a capacitor (e.g., one of the capacitors 140 (FIG. 13)) and a transistor (e.g., one of the vertical transistors 133 (FIG. 13)). The capacitor stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the word lines 206) of a minimum threshold voltage to a semiconductive channel thereof for operations (e.g., reading, writing, rewriting) on the capacitor.

The digit lines 204 are connected to the capacitors of the memory cells 202 by way of the transistors of the memory cells 202. The word lines 206 extend perpendicular to the digit lines 204, and are connected to gates of the transistors of the memory cells 202. Operations may be performed on the memory cells 202 by activating appropriate digit lines 204 and word lines 206. Activating a digit line 204 or a word line 206 may include applying a voltage potential to the digit line 204 or the word line 206. Each column of memory cells 202 may individually be connected to one of the digit lines 204, and each row of the memory cells 202 may individually be connected to one of the word lines 206. Individual memory cells 202 may be addressed and accessed through the intersections (e.g., cross points) of the digit lines 204 and the word lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined word lines 206, and may generate column address signals that are directed to the column decoder 210 to activate (e.g., apply a voltage potential to) predetermined digit lines 204. The memory controller 212 may also generate and control various voltage potentials employed during the operation of the memory device 200. In general, the amplitude, shape, and/or duration of an applied voltage may be adjusted (e.g., varied), and may be different for various operations of the memory device 200.

During use and operation of the memory device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate word line 206 and an appropriate digit line 204 of the memory device 200. By controlling the digit line 204 while the word line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the word line 206 associated with the memory cell 202 is deactivated, all of memory cells 202 in the row associated with the word line 206 are restored to full charge or discharge.

Thus, in accordance with embodiments of the disclosure, a memory device comprises word lines, digit lines, a barrier structure substantially impermeable to hydrogen overlying the digit lines, memory cells overlying the barrier structure and electrically coupled to the word lines and the digit lines, and another barrier structure substantially impermeable to hydrogen overlying the memory cells. Each memory cell comprises a vertical transistor electrically coupled at least one of the word lines, and a capacitor electrically coupled to the vertical transistor. The vertical transistor comprises a channel pillar over one of the digit lines and comprising at least one semiconductor material having a larger bandgap than polycrystalline silicon, at least one gate electrode laterally neighboring the channel pillar, and a dielectric liner structure between the channel pillar and the at least one gate electrode.

Figure 15:
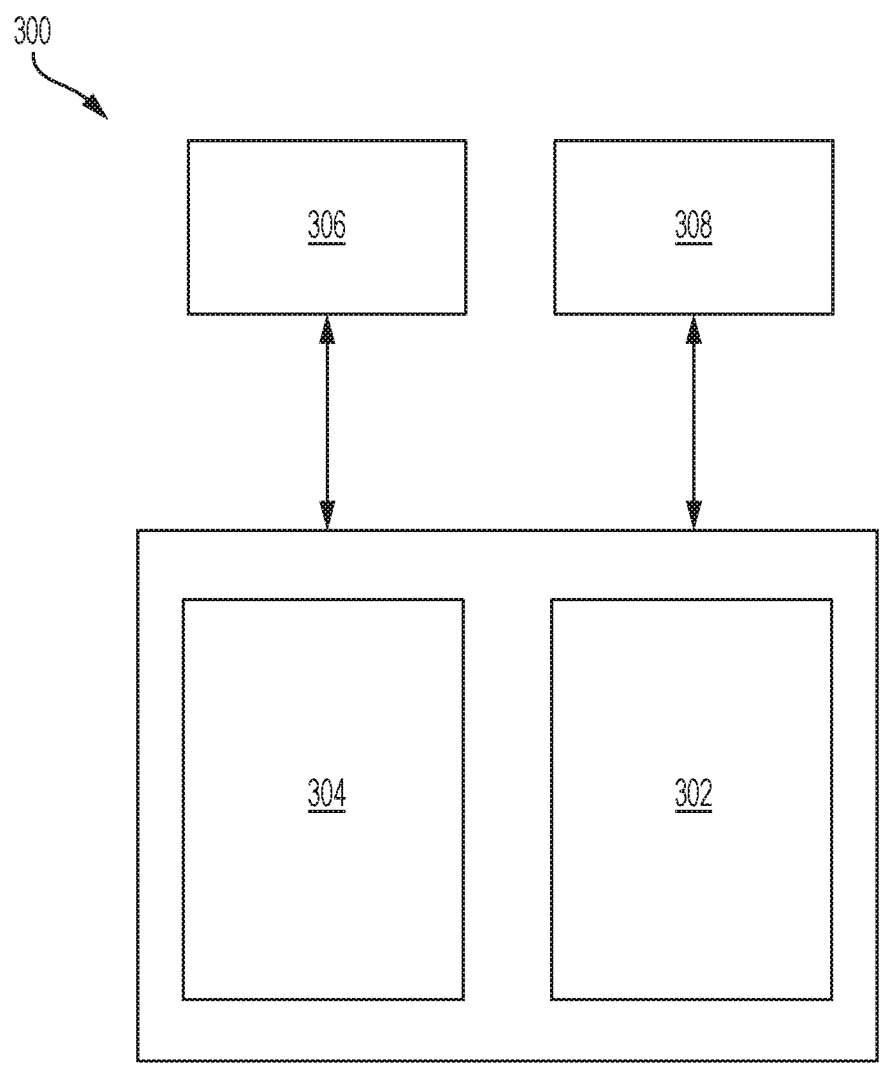
FIG. 15 is a schematic block diagram of an electronic system, in accordance with an embodiment of the disclosure.

Semiconductor device structures (e.g., the semiconductor device structure 100 (FIG. 13)) and semiconductor devices (e.g., the memory device 200 (FIG. 14)) in accordance with embodiments of the disclosure may be used in embodiments of electronic systems of the disclosure. For example, FIG. 15 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a semiconductor device structure (e.g., semiconductor device structure 100 (FIG. 13)) and a semiconductor device (e.g., the memory device 200 (FIG. 14)) previously described herein. The electronic system 300 may further include at least one electronic signal processor device 304 (often referred to as a "microprocessor"). The electronic signal processor device 304 may, optionally, include an embodiment of a semiconductor device structure (e.g., semiconductor device structure 100 (FIG. 13)) and a semiconductor device (e.g., the memory device 200 (FIG. 14)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, and/or a speaker. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a device operably coupled to the processor device. The semiconductor device comprises a first barrier structure, a vertical transistor, and a second barrier structure. The first barrier structure is substantially impermeable to hydrogen. The vertical transistor overlies the first barrier structure and comprises a channel structure comprising at least one semiconductor material having a larger bandgap than polycrystalline silicon, a gate dielectric material laterally surrounding the channel structure, and a gate electrode laterally adjacent the gate dielectric material. The second barrier structure is substantially impermeable to hydrogen and overlies the gate dielectric material and the gate electrode of the vertical transistor.

The methods of the disclosure may facilitate the formation of devices (e.g., transistors, semiconductor devices, memory devices) and systems (e.g., electronic systems) having one or more of increased performance, increased efficiency, increased reliability, and increased durability as compared to conventional devices (e.g., conventional access devices, conventional semiconductor devices, conventional memory devices) and conventional systems (e.g., conventional electronic systems). For example, the methods of the disclosure may facilitate improved current flow properties in channel structures (e.g., the channel structures 130) formed through the methods of the disclosure as compared to conventional channel pillars formed through conventional processes (e.g., conventional channel pillars formed by vertically etching a bulk volume of semiconductive material using one or more using one or more conventional etch chemistries, such as conventional hydrogen-containing plasma chemistries), facilitating improved performance and reliability in devices (e.g., access devices, semiconductor devices, memory devices) and systems (e.g., electronic systems) including the channel structures of the disclosure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:
1. A device, comprising:
a first barrier structure comprising one or more of $AlO_x$, $AlO_xN_y$, $AlSi_xN_y$, and $AlSi_xO_yN_z$;
conductive line structures overlying the first barrier structure and laterally extending in a first direction;
channel pillars overlying the conductive line structures and each comprising a semiconductive material having a band gap larger than that of polycrystalline silicon;
dielectric liner structures substantially laterally surrounding sidewalls of the channel pillars;
gate electrodes laterally adjacent outer sidewalls of the dielectric liner structures and laterally extending in a second direction substantially perpendicular to the first direction;
conductive contacts overlying the channel pillars;
a second barrier structure overlying and laterally extending across upper surfaces of the dielectric liner structures and the gate electrodes, the second barrier structure comprising one or more of $AlO_x$, $AlO_xN_y$, $AlSi_xN_y$, and $AlSi_xO_yN_z$;
a dielectric material overlying an upper surface of the second barrier structure; and
capacitors within apertures extending through the dielectric material and the second barrier structure to upper surfaces of the conductive contacts.

2. The device of claim 1, further comprising a third barrier structure substantially impermeable to hydrogen overlying portions of the capacitors and the dielectric material.

3. The device of claim 1, further comprising conductive structures on the conductive line structures and laterally adjacent the channel pillars.

4. A device, comprising:
a first barrier structure substantially impermeable to hydrogen;
conductive line structures overlying the first barrier structure and laterally extending in a first direction, the conductive line structures comprising one or more of Ru, Mo, and TiN;
channel pillars overlying the conductive line structures and each comprising one or more of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, and $Zr_xZn_ySn_zO$;
dielectric liner structures substantially laterally surrounding sidewalls of the channel pillars;

gate electrodes laterally adjacent outer sidewalls of the dielectric liner structures and laterally extending in a second direction substantially perpendicular to the first direction;

conductive contacts overlying the channel pillars; and a second barrier structure substantially impermeable to hydrogen overlying and laterally extending across upper surfaces of the dielectric liner structures and the gate electrodes, the second barrier structure in direct physical contact with the dielectric liner structures, and the first barrier structure and the second barrier structure each individually comprising one or more of $AlO_x$, $AlO_xN_y$, $AlSi_xN_y$, and $AlSi_xO_yN_z$.

5. A memory device, comprising:

word lines;

digit lines;

a barrier structure underlying the digit lines and comprising one or more of $AlO_x$, $AlO_xN_y$, $AlSi_xN_y$, and $AlSi_xO_yN_z$; lines;

memory cells overlying the barrier structure and electrically coupled to the word lines and the digit lines, each memory cell comprising:

a vertical transistor electrically coupled to at least one of the word lines, the vertical transistor comprising:

a channel pillar over one of the digit lines and laterally neighboring the at least one of the word lines, the channel pillar comprising at least one semiconductor material having a larger bandgap than polycrystalline silicon; and a dielectric liner structure between the channel pillar and the at least one of the word lines; and a capacitor electrically coupled to the vertical transistor;

an additional barrier structure overlying the at least one of the word lines and the dielectric liner structure of each of the memory cells and comprising one or more of $AlO_x$, $AlO_xN_y$, $AlSi_xN_y$, and $AlSi_xO_yN_z$, a lower portion of the capacitor of each of the memory cells vertically extending entirely through the additional barrier structure; and another barrier structure overlying the memory cells and comprising one or more of $AlO_x$, $AlO_xN_y$, $AlSi_xN_y$, and $AlSi_xO_yN_z$.

6. The memory device of claim 5, wherein the channel pillar of each of the memory cells comprises an oxide semiconductor material.

7. An electronic system, comprising:

an input device;

an output device;

a processor device operably coupled to the input device and the output device; and a device operably coupled to the processor device and comprising:

a first barrier structure comprising one or more of $AlO_x$, $AlO_xN_y$, $AlSi_xN_y$, and $AlSi_xO_yN_z$;

a vertical transistor overlying the first barrier structure and comprising:

a channel structure comprising at least one semiconductor material having a larger bandgap than polycrystalline silicon;

a gate dielectric material laterally surrounding the channel structure; and a gate electrode laterally adjacent the gate dielectric material; and a second barrier structure overlying the gate dielectric material and the gate electrode of the vertical transistor, the second barrier structure comprising one or more of $AlO_x$, $AlO_xN_y$, $AlSi_xN_y$, and $AlSi_xO_yN_z$.

* * * * *

UNITED STATES PATENT AND TRADEMARK OFFICE
CERTIFICATE OF CORRECTION

PATENT NO. : 12,527,000 B2
APPLICATION NO. : 16/596507
DATED : January 13, 2026
INVENTOR(S) : Durai Vishak Nirmal Ramaswamy Page 1 of 2

It is certified that error appears in the above-identified patent and that said Letters Patent is hereby corrected as shown below:

In the Specification

| | | |
|---|---|---|
| Column 5, | Line 33, | change "$AlSi_xO_yN_z\ BN_x$," to --$AlSi_xO_yN_z, BN_x$,-- |
| Column 9, | Line 4, | change "have a width a within a range" to --have a width within a range-- |
| Column 15, | Line 46, | change "comprises Sift. The" to --comprises $SiO_2$. The-- |

In the Claims

| | | | |
|---|---|---|---|
| Claim 1, | Column 20, | Line 46, | change "conductive contacts." to --conductive contacts, lower portions of the capacitors contacting the second barrier structure, and upper portions of the capacitors contacting the dielectric material.-- |
| Claim 4, | Column 20, | Line 56, | change "structures overlying the first" to --structures directly physically contacting the first-- |
| Claim 4, | Column 20, | Line 59, | change "Ru, Mo, and TiN;" to --Ru and TiN;-- |
| Claim 5, | Column 21, | Line 20, | change "$AlSi_xO_yN_z$; lines; memory cells" to --$AlSi_xO_yN_z$; memory cells-- |
| Claim 7, | Column 22, | Line 22, | change "transistor overlying" to --transistor vertically overlying-- |
| Claim 7, | Column 22, | Line 31, | change "barrier structure overlying" to --barrier structure vertically overlying-- |
| Claim 7, | Column 22, | Line 31, | change "overlying the gate" to --overlying each of the gate-- |
| Claim 7, | Column 22, | Line 33, | change "barrier structure comprising" to |

Signed and Sealed this
Tenth Day of February, 2026

John A. Squires
*Director of the United States Patent and Trademark Office*

CERTIFICATE OF CORRECTION (continued)
U.S. Pat. No. 12,527,000 B2

| | | | |
|---|---|---|---|
| | | | --barrier structure in direct physical contact with the gate dielectric material and comprising-- |
| Claim 7, | Column 22, | Line 34, | change "$AlSi_xN_y$, and $AlSi_xO_yN_z$." to --$AlSi_xN_y$, and $Ali_{SsOn}$.-- |